United States Patent
Watanabe

(10) Patent No.: US 10,748,950 B2
(45) Date of Patent: Aug. 18, 2020

(54) LIGHT RECEIVING ELEMENT AND ELECTRONIC APPARATUS

(71) Applicant: SONY SEMICONDUCTOR SOLUTIONS CORPORATION, Kanagawa (JP)

(72) Inventor: Ryota Watanabe, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 16/486,623

(22) PCT Filed: Mar. 1, 2019

(86) PCT No.: PCT/JP2019/008011
§ 371 (c)(1),
(2) Date: Aug. 16, 2019

(87) PCT Pub. No.: WO2019/176582
PCT Pub. Date: Sep. 19, 2019

(65) Prior Publication Data
US 2020/0020731 A1 Jan. 16, 2020

(51) Int. Cl.
*H01L 27/14* (2006.01)
*H01L 27/146* (2006.01)
(Continued)

(52) U.S. Cl.
CPC .... *H01L 27/14623* (2013.01); *H01L 27/1464* (2013.01); *H01L 27/14636* (2013.01); *G01S 17/89* (2013.01); *H04N 2005/2255* (2013.01)

(58) Field of Classification Search
CPC ... H01L 27/14; H01L 27/146; H01L 27/1462; H01L 27/1463; H01L 27/1464; H01L 27/14623; H01L 27/14636; G01S 17/89
(Continued)

(56) References Cited

U.S. PATENT DOCUMENTS 6,825,455 B1  11/2004  Schwarte
7,795,676 B2 *  9/2010  Mabuchi ........... H01L 27/14603
                                                    257/291

(Continued)

FOREIGN PATENT DOCUMENTS

JP  2011-086904  4/2011

OTHER PUBLICATIONS

International Search Report and Written Opinion prepared by the European Patent Office dated May 27, 2019, for International Application No. PCT/JP2019/008011.

*Primary Examiner* — Monica D Harrison
(74) *Attorney, Agent, or Firm* — Sheridan Ross P.C.

(57) ABSTRACT

There is provided a light receiving element including; an on-chip lens; a wiring layer; and a semiconductor layer disposed between the on-chip lens and the wiring layer. The semiconductor layer includes a first voltage applying unit to which a first voltage is applied, a second voltage applying unit to which a second voltage different from the first voltage is applied, a first charge detection unit disposed in a vicinity of the first voltage applying unit, and a second charge detection unit disposed in a vicinity of the second voltage applying unit, and the wiring layer includes a reflection suppressing structure that suppresses reflection of light in a plane region corresponding to the first charge detection unit and the second charge detection unit.

10 Claims, 32 Drawing Sheets

(51) Int. Cl.
*G01S 17/89* (2020.01)
*H04N 5/225* (2006.01)

(58) Field of Classification Search
USPC .......................................................... 257/431
See application file for complete search history.

(56) References Cited

U.S. PATENT DOCUMENTS

| | | |
|---|---|---|
| 2005/0092897 A1 | 5/2005 | Schwarte |
| 2010/0097508 A1 | 4/2010 | Yanagita et al. |
| 2010/0201966 A1 | 8/2010 | Mase et al. |
| 2011/0255071 A1 | 10/2011 | Van Der Tempel et al. |
| 2012/0307231 A1 | 12/2012 | Mase et al. |
| 2012/0307232 A1 | 12/2012 | Mase et al. |
| 2014/0042302 A1 | 2/2014 | Yanagita et al. |
| 2016/0088254 A1 | 3/2016 | Yanagita et al. |
| 2018/0007306 A1 | 1/2018 | Yanagita et al. |

\* cited by examiner

LIGHT RECEIVING ELEMENT AND ELECTRONIC APPARATUS

CROSS REFERENCE TO RELATED APPLICATIONS

This application is a national stage application under 35 U.S.C. 371 and claims the benefit of PCT Application No. PCT/JP2019/008011 having an international filing date of 1 Mar. 2019, which designated the United States, which PCT application claimed the benefit of Japanese Priority Patent Application No. 2018-049696 filed on 16 Mar. 2018, the disclosures of each of which are incorporated herein by reference.

TECHNICAL FIELD

The present technology relates to a light receiving element and an electronic apparatus, and more particularly to a light receiving element and an electronic apparatus capable of improving characteristics.

BACKGROUND ART

In the related art, a ranging system using an indirect time of flight (ToF) method is known. In such a ranging system, a sensor that is able to distribute a signal charge obtained by receiving light due to reflection of active light radiated using a tight emitting diode (LED) or a laser at a certain phase from a target object to another region at a high speed is indispensable.

Therefore, for example, a technique in which a voltage is directly applied to a substrate of a sensor to generate a current in the substrate so that a wide region in the substrate is able to be modulated at a high speed has been proposed (refer to, for example, PTL 1). Such a sensor is also referred to as a current assisted photonic demodulator (CAPD) sensor.

CITATION LIST

Patent Literature

PTL 1
JP 2011-86904A

SUMMARY OF INVENTION

Technical Problem

The CAPD sensor described above is a sensor of a surface irradiation type in which a wiring and the like are disposed on a surface of a side on which light from the outside of a substrate is received. In order to secure a photoelectric conversion region, it is desirable that there is no a photodiode (PD), that is, a wiring or the like on a light receiving surface side of a photoelectric conversion unit, which blocks an optical path of incident light. However, in the CAPD sensor of the surface irradiation type, it is necessary to dispose a wiring for extracting a charge, various control lines, or a signal line on the light receiving surface side of the PD due to a structure, and thus the photoelectric conversion region is limited. That is, a sufficient photoelectric conversion region is not able to be secured, and a characteristic such as pixel sensitivity may be reduced in some cases.

It is desirable to improve characteristics.

Solution to Problem

A light receiving element of a first embodiment of the present technology includes an on-chip lens; a wiring layer; and a semiconductor layer disposed between the on-chip lens and the wiring layer. The semiconductor layer includes a first voltage applying unit to which a first voltage is applied, a second voltage applying unit to which a second voltage different from the first voltage is applied, a first charge detection unit disposed in a vicinity of the first voltage applying unit, and a second charge detection unit disposed in a vicinity of the second voltage applying unit, and the wiring layer includes a reflection suppressing structure that suppresses reflection of light in a plane region corresponding to the first charge detection unit and the second charge detection unit.

An electronic apparatus of a second embodiment of die present technology includes: a light receiving element including an on-chip lens, a wiring layer, and a semiconductor layer disposed between the on-chip lens and the wiring layer. The semiconductor layer includes a first voltage applying unit to which a first voltage is applied, a second voltage applying unit to which a second voltage different from the first voltage is applied, a first charge detection unit disposed in a vicinity of the first voltage applying unit, and a second charge detection unit disposed in a vicinity of the second voltage applying unit, and the wiring layer includes, a reflection suppressing structure that suppresses reflection of light in a plane region corresponding to the first charge detection unit and the second charge detection unit.

In the first and second embodiments of the present technology, an on-chip lens, a wiring layer, and a semiconductor layer disposed between the on-chip lens and the wiring layer are provided. In the semiconductor layer are provided a first voltage applying unit to which a first voltage is applied, a second voltage applying unit to which a second voltage different from the first voltage is applied, a first charge detection unit disposed in a vicinity of the first voltage applying unit, and a second charge detection unit disposed in a vicinity of the second voltage applying unit. In the wiring layer is provided a reflection suppressing structure that suppresses reflection of light in a plane region corresponding to the first charge detection unit and the second charge detection unit.

The light receiving element and the electronic apparatus may be independent devices or may be modules incorporated in other devices.

Advantageous Effects of Invention

According to the first and second embodiments of the present technology, it is possible to improve characteristics.

Note that the effects described herein are not necessarily limitative and any of the effects described in the present disclosure may be applied.

DESCRIPTION OF EMBODIMENTS

Hereinafter, an embodiment for implementing the present technology (hereinafter, referred to as an embodiment) will be described. Note that the description will be given in the following order.

1. Example of Basic Configuration of Light Receiving Element
2. Necessity of Enhancement of Basic Pixel Structure
3. First Embodiment of Pixel
4. Second Embodiment of Pixel
5. Third Embodiment of Pixel
6. Fourth Embodiment of Pixel
7. Fifth Embodiment of Pixel
8. Sixth Embodiment of Pixel
9. Seventh Embodiment of Pixel
10. Eighth Embodiment of Pixel
11. Ninth Embodiment of Pixel
12. Summary
13. Example of Configuration of Ranging Module
14. Example of Application to Endoscopic Surgical System
15. Example of Application to Mobile Object 1. Example of Basic Configuration of Light Receiving Element The present technology is related to a light receiving element that functions as a CAPD sensor of a read surfaced illumination type, and a basic structure of light receiving element will be described first as a premise of a light receiving element to which an embodiment of the present technology is applied.

<Block Diagram>

Figure 1:
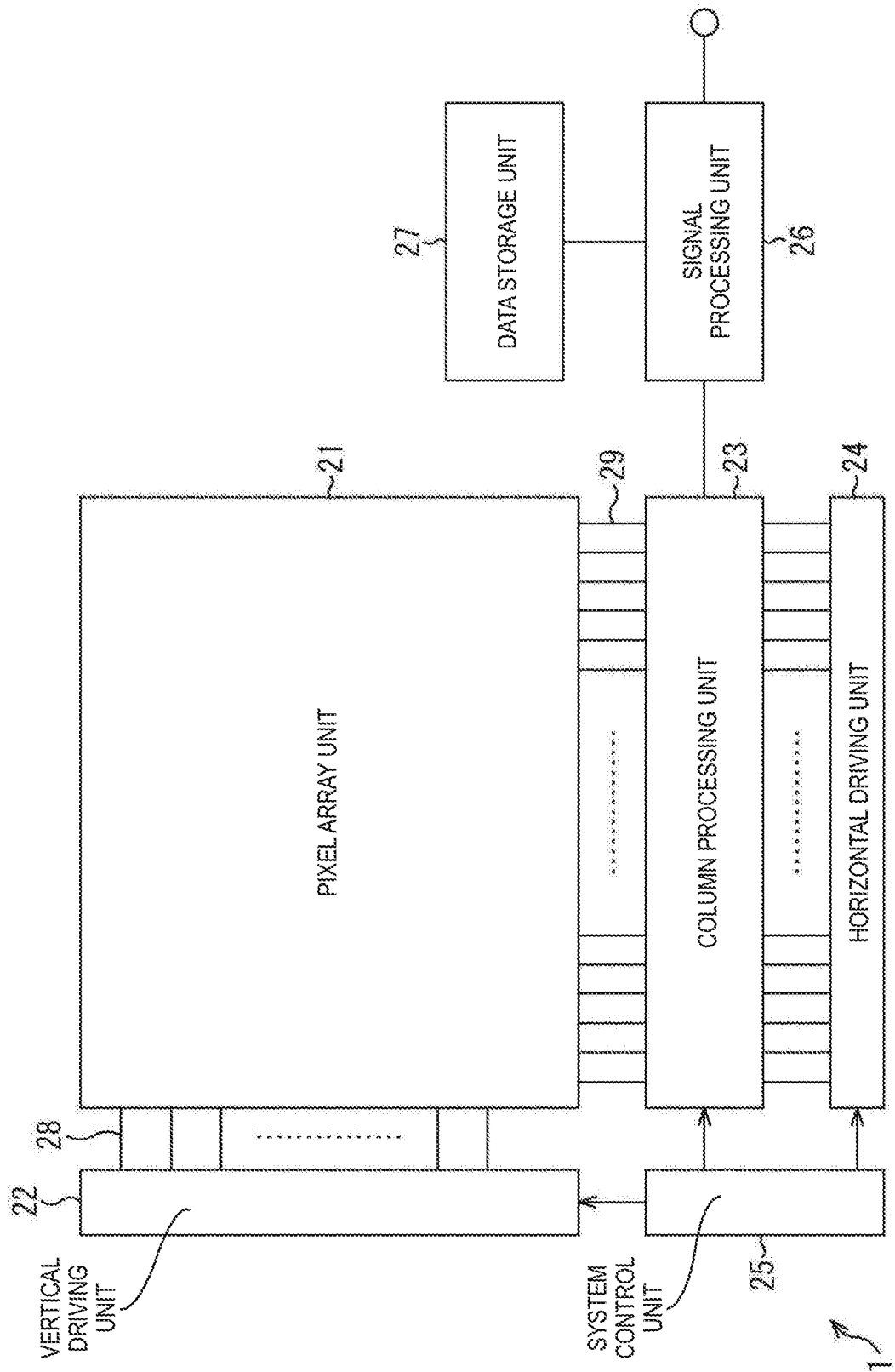
FIG. 1 is a block diagram illustrating an example of a configuration of a light receiving element.

FIG. 1 is a block diagram illustrating an example of a configuration of a light receiving element.

The light receiving element 1 shown in FIG. 1 is an element that functions as a CAPD sensor of a rear surface illumination type, and, for example, the light receiving element 1 is used as a part of a ranging system that performs distance measurement by an indirect ToF method. For example, the ranging system is able to be applied to an in-vehicle system that is installed on a vehicle and measures a distance to a target object outside a vehicle, a gesture recognizing system that measures a distance to a target object such as a hand of a user and recognizes a gesture of the user on the basis of a measurement result, and the like.

The light receiving element 1 has a pixel array unit 21 formed on a semiconductor substrate (not shown) and a peripheral circuit unit integrated on the same semiconductor substrate the same as the pixel array unit 21. Tire peripheral circuit unit includes, for example, a vertical driving unit 22, a column processing unit 23, a horizontal driving unit 24, a system control unit 25, and the like.

The light receiving element 1 is further provided with a signal processing unit 26 and a data storage unit 27. Note that the signal processing unit 26 and the data storage unit 27 may be mounted on the same substrate as the light receiving element 1 or may be disposed on a substrate separate from the light receiving element 1 in the imaging apparatus.

The pixel array unit 21 has a configuration in which pixels that generate a charge corresponding to a received light amount and output a signal corresponding to the charge are two-dimensionally disposed in a row direction and a column direction, that is, a matrix shape. That is, the pixel array unit 21 has a plurality of pixels that performs photoelectric conversion on incident light and outputs a signal corresponding to a charge obtained as a result.

Here, the row direction refers to an arrangement direction of the pixels of a pixel row (that is, a horizontal direction), and the column direction refers to an arrangement direction of the pixels of a pixel column (that is, a vertical direction). That is, the row direction is a horizontal direction in the figure, and the column direction is a vertical direction in the figure.

In the pixel array unit 21, with respect to the pixel array of the matrix shape, a pixel drive line 28 is wired along a row direction for each pixel row, and two vertical signal lines 29 are wired along a column direction for each pixel column. For example, the pixel drive line 28 transmits a drive signal for driving when reading a signal from the pixel. Note that, although FIG. 1 shows one wire for the pixel drive line 28, the pixel drive line 28 is not limited to one. One end of the pixel drive line 28 is connected to an output end corresponding to each row of the vertical driving unit 22.

The vertical driving unit 22 includes a shift register, an address decoder, or the like. The vertical driving unit 22 drives each pixel of all pixels of the pixel array unit 21 at the same time, or in row units, or the like. That is, the vertical driving unit 22 includes a driving unit that controls operation of each pixel of the pixel array unit 21, together with the system control unit 25 that controls the vertical driving unit 22.

Note that, in the distance measurement using the indirect ToF method, the number of elements (CAPD elements) that are connected to one control line and are to be driven at a high speed influences controllability of high speed driving and accuracy of driving. The light receiving element used for the distance measurement of the indirect ToF method may include a pixel array that is long in the horizontal direction. Therefore, in such a case, regarding the control line of the element to be driven at a high speed, the vertical signal line 29 or another control line that is long in the vertical direction may be used. In this case, for example, a plurality of pixels arranged in the vertical direction is connected to the vertical signal line 29 or the other control line that is long in the vertical direction, and the pixel is driven, that is, the CAPD sensor is driven, by a driving unit provided separately from the vertical driving unit 22, the horizontal driving unit 24, or the like, through such a vertical signal line 29 or the other control line.

The signals output from each pixel of a pixel row in response to drive control by the vertical driving unit 22 are input to the column processing unit 23 through the vertical signal line 29. The column processing unit 23 performs a predetermined signal process on the signal output from each pixel through the vertical signal line 29 and temporarily holds the pixel signal after the signal process. Specifically, the column processing unit 23 performs a noise removal process, an analog to digital (AD) conversion process, and the like as the signal process.

The horizontal driving unit 24 includes a shift register, an address decoder, or the like, and sequentially selects unit circuits corresponding to pixel columns of the column processing unit 23. The column processing unit 23 sequentially outputs the pixel signals obtained through the signal process for each unit circuit, by a selective scan by the horizontal driving unit 24.

The system control unit 25 includes a timing generator or the like that generates various timing signals and performs drive control on the vertical driving unit 22, the column processing unit 23, the horizontal driving unit 24, and the like, on the basis of the various generated timing signals.

The signal processing unit 26 has at least a calculation process function and performs various signal processes such as a calculation process on the basis of the pixel signal output from the column processing unit 23. The data storage unit 27 temporarily stores data necessary for the signal process in the signal processing unit 26.

The light receiving element 1 is able to be configured as described above.

<Example of Cross-Sectional Configuration of Pixel>

Next, an example of a configuration of a pixel provided in the pixel array unit 21 will be described. For example, die pixel provided in the pixel array unit 21 is configured as shown in FIG. 2.

Figure 2:
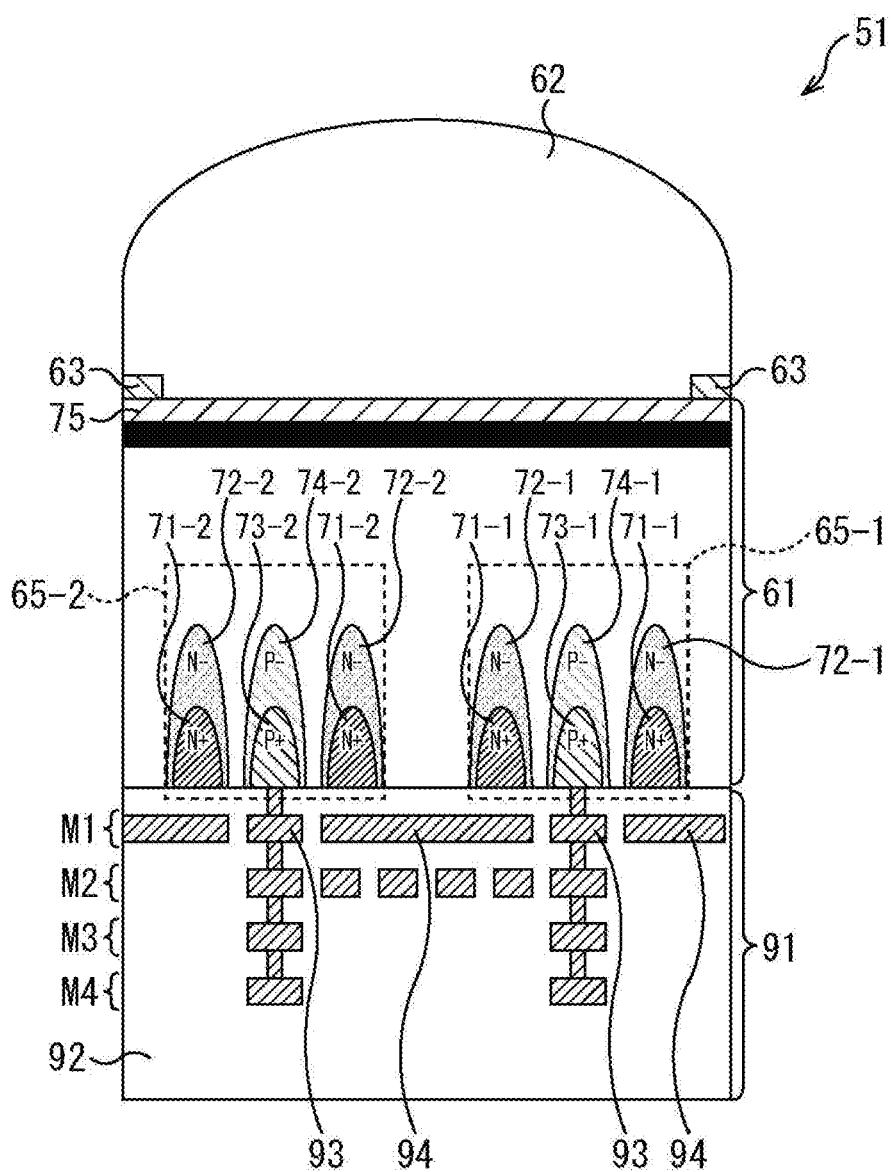
FIG. 2 is a cross-sectional view of a pixel of the light receiving element of FIG. 1.

FIG. 2 illustrates a cross sectional view of one pixel 51 provided in the pixel array unit 21. The pixel 51 receives light incident from the outside, in particular, infrared light, performs photoelectric conversion on the incident light, and outputs a signal according to a charge obtained as a result.

For example, the pixel 51 has a semiconductor substrate 61 including a P-type semiconductor layer, that is, a silicon substrate, for example, and an on-chip lens 62 formed on the semiconductor substrate 61.

For example, a thickness of the semiconductor substrate 61 in a vertical direction in the drawing, that is, the thickness in a direction perpendicular to a surface of the semiconductor substrate 61, is set to be 20 µm or less. Note that it is a matter of course that the thickness of the semiconductor substrate 61 may be 20 µm or more, and it is sufficient if die thickness of the semiconductor substrate 61 is determined according to a targeted characteristic and tire like of the light receiving element 1.

In addition, the semiconductor substrate 61 is a P-Epi substrate or the like having a high resistance, for example, having a substrate concentration on the order of 1E+13 or less, and the resistance (resistivity) of the semiconductor substrate 61 is set to be, for example, 500 Ωcm or more.

Here, a relationship between the substrate concentration and the resistance of the semiconductor substrate 61 is, for example, a resistance of 2000 Ωcm when the substrate concentration is 6.48E+12 cm$^3$, a resistance of 1000 Ωcm when the substrate concentration is 1.30E+13 cm$^3$, a resistance of 500 Ωcm when the substrate concentration is 2.59E+13 cm$^3$, a resistance of 100 Ωcm when the substrate concentration is 1.30E+14 cm$^3$, and the like.

An on-chip lens 62 condensing light incident from the outside and causing the light to enter the inside of the semiconductor substrate 61 is formed on an upper surface in the figure of the semiconductor substrate 61, that is, on a surface of a side of the semiconductor substrate 61 on which light is incident from die outside (hereinafter, also referred to as a light incident surface).

Furthermore, an inter-pixel light shielding film 63 for preventing color mixing between adjacent pixels is formed at a boundary portion of the pixel 51 on the light incident surface of the semiconductor substrate 61. The inter-pixel light shielding film 63 prevents the light incident on the pixel 51 from being incident on another pixel 51 provided adjacent to tire pixel 51.

A signal extraction unit 65-1 and a signal extraction unit 65-2 referred to as a tap are formed on a surface side opposite to the light incident surface in the semiconductor substrate 61, that is, in a portion of an inner side of a surface of a lower side in the figure.

The signal extraction unit 65-1 has an N+ semiconductor region 71-1 and an N− semiconductor region 72-1 having a donor impurity concentration lower than that of the N+ semiconductor region 71-1 which are an N type semiconductor region, and a P+ semiconductor region 73-1 and a P− semiconductor region 74-1 having an acceptor impurity concentration lower than that of the P+ semiconductor region 73-1 which are a P type semiconductor region. Here, an example of a donor impurity with respect to Si may include an element belonging to group 5 in the periodic table of the elements, such as phosphorus (P) or arsenic (As), and an example of an acceptor impurity with respect to Si may include an element belonging to group 3 in the periodic table of the elements, such as boron (B). An element serving as the donor impurity is referred to as a donor element, and an element serving as the acceptor impurity is referred to as an acceptor element.

An N− semiconductor region 72-1 is formed on an upper side of the N+ semiconductor region 71-1 so as to cover (surround) the semiconductor region 71-1. Similarly, a P− semiconductor region 74-1 is formed on an upper side of the P+ semiconductor region 73-1 so as to cover (surround) the P+ semiconductor region 73-1.

In a plan view, as will be described later with reference to FIG. 3, the N+ semiconductor region 71-1 is formed so as to surround a vicinity of the P+ semiconductor region 73-1, with the P+ semiconductor region 73-1 as a center. Similarly, the N− semiconductor region 72-1 formed on the upper side of the N+ semiconductor region 71-1 is also formed so as to surround a vicinity of the P− semiconductor region 74-1, with the P− semiconductor region 74-1 as a center.

Similarly, the signal extraction unit 65-2 has an N+ semiconductor region 71-2 and an N− semiconductor region 72-2 having a donor impurity concentration lower than that of the N+ semiconductor region 71-2 which are an N type semiconductor region, and a P+ semiconductor region 73-2 and a P− semiconductor region 74-2 having an acceptor impurity concentration lower than that of the P+ semiconductor region 73-2 which are a P type semiconductor region.

An N− semiconductor region 72-2 is formed on an upper side of the N+ semiconductor region 71-2 so as to cover (surround) the N+ semiconductor region 71-2. Similarly, a P− semiconductor region 74-2 is formed on an upper side of the P+ semiconductor region 73-2 so as to cover (surround) the P+ semiconductor region 73-2.

In a plan view, as will described later with reference to FIG. 3, the N+ semiconductor region 71-2 is formed so as to surround a vicinity of the P+ semiconductor region 73-2, with the P+ semiconductor region 73-2 as a center. Similarly, the N-semiconductor region 72-2 formed on the upper side of the N+ semiconductor region 71-2 is also formed so as to surround a vicinity of the P− semiconductor region 74-2, with the P− semiconductor region 74-2 as a center.

Hereinafter, in a case in which it is not necessary to particularly distinguish between the signal extraction unit 65-1 and the signal extraction unit 65-2, the signal extraction unit 65-1 and the signal extraction unit 65-2 are also simply referred to as a signal extraction unit 65.

In addition, hereinafter, in a case in which it is not necessary to particularly distinguish between the N+ semiconductor region 71-1 and the N+ semiconductor regions 71-2, the N+ semiconductor region 71-1 and the N+ semiconductor regions 71-2 are also simply referred to as an N+ semiconductor region 71, and in a case in which it is not necessary to particularly distinguish between the N− semiconductor region 72-1 and the N− semiconductor region 72-2, the N− semiconductor region 72-1 and the N− semiconductor region 72-2 are also simply referred to as an N− semiconductor region 72.

Furthermore, hereinafter, in a case in which it is not necessary to particularly distinguish between the P+ semiconductor region 73-1 and the P+ semiconductor region 73-2, the P+ semiconductor region 73-1 and the P+ semiconductor region 73-2 are also simply referred to as a P+ semiconductor region 73, and in a case in which it is not necessary to particularly distinguish between the P− semiconductor region 74-1 and the P− semiconductor region 74-2, the P− semiconductor region 74-1 and the P− semiconductor region 74-2 are also simply referred to as a P− semiconductor region 74.

A P+ semiconductor region 75 covering the entire light incident surface by stacking films having positive fixed charges is formed on an interface on the light incident surface side of the semiconductor substrate 61.

Figure 11:
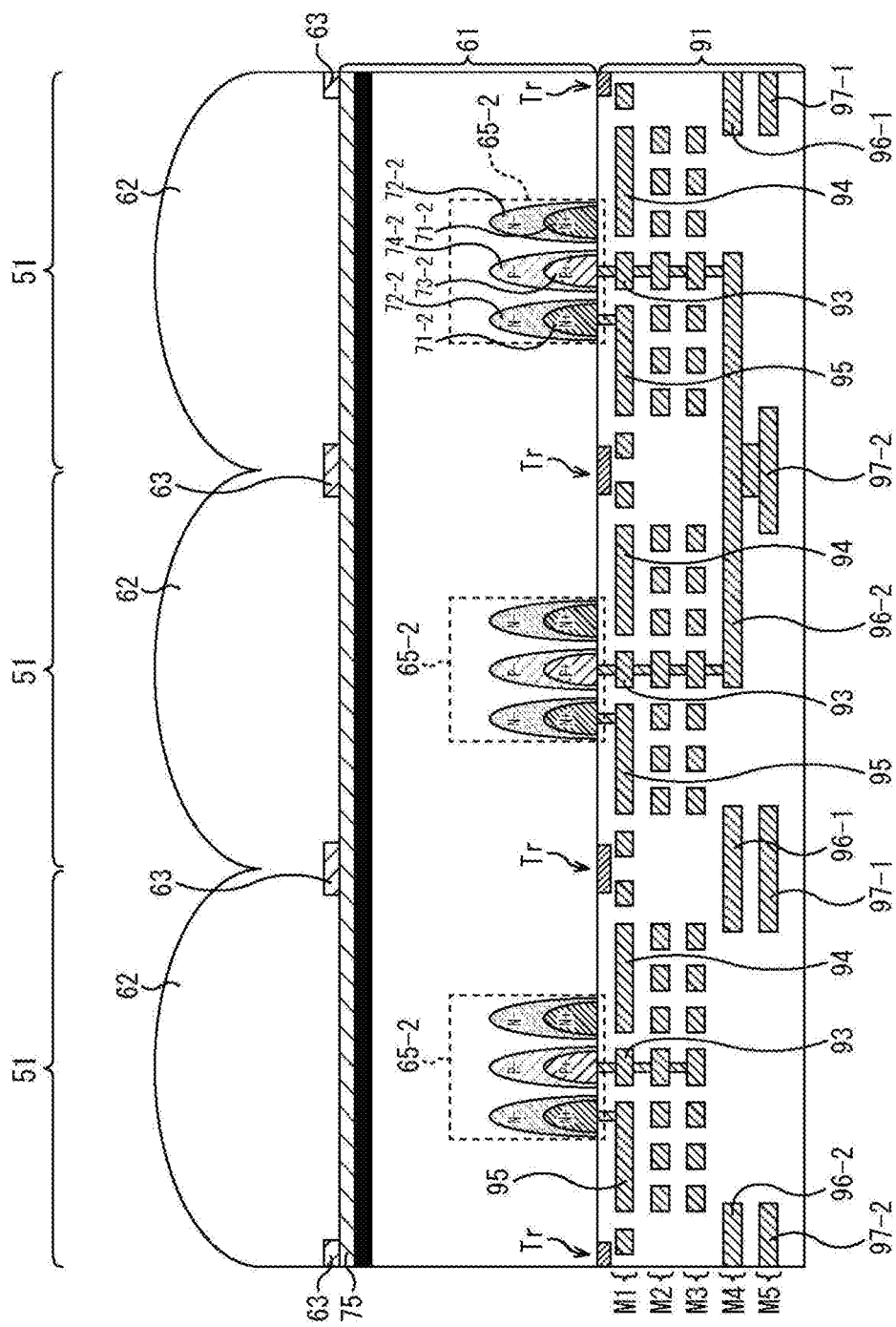
FIG. 11 is a cross-sectional view of a plurality of pixels of the light receiving element of FIG. 1.

On the other hand, a multilayer wiring layer 91 is formed on the side opposite to the light incident surface side of the semiconductor substrate 61 on which the on-chip lens 62 is formed for each pixel. In other words, the semiconductor substrate 61 that is a semiconductor layer is disposed between the on-chip lens 62 and the multilayer wiring layer 91. The multilayer wiring layer 91 includes five layers of metal films M1 to M5 and interlayer insulating films 92 therebetween. Note that, among the five layers of metal films M1 to M5 of the multilayer wiring layer 91, although the outermost metal film M5 is not shown in FIG. 2 since the outermost metal film M5 is positioned at a position at which it is not able to be seen, the outermost metal film M5 is shown in FIG. 11 that will be described later.

The metal film M1 closest to the semiconductor substrate 61 among the five layers of metal films M1 to M5 of the multilayer wiring layer 91 is provided with a voltage applying wiring 93 for applying a predetermined voltage to the P+ semiconductor region 73-1 or 73-2 and a reflection member 94 that is a member that reflects the incident light.

Therefore, the light receiving element 1 of FIG. 1 is a CAPD sensor of a rear surface irradiation type, in which the light incident surface of the semiconductor substrate 61 is a so-called rear surface, on a side opposite to a side of the multilayer wiring layer 91.

The N+ semiconductor region 71 provided on the semiconductor substrate 61 functions as a charge detection unit for detecting a light amount of the light incident on the pixel 51 from the outside, that is, an amount of a signal carrier generated by the photoelectric conversion by the semiconductor substrate 61. Note that, in addition to the N+ semiconductor region 71, the N− semiconductor region 72 having a low donor impurity concentration is also able to be regarded as the charge detection unit.

In addition, the P+ semiconductor region 73 functions as a voltage applying unit for injecting a majority carrier current into the semiconductor substrate 61, that is, applying a voltage directly to the semiconductor substrate 61 to generate an electric field in the semiconductor substrate 61. Note that, in addition to the P+ semiconductor region 73, the P− semiconductor region 74 having a low acceptor impurity concentration is also able to be regarded as a voltage applying unit.

Figure 3:
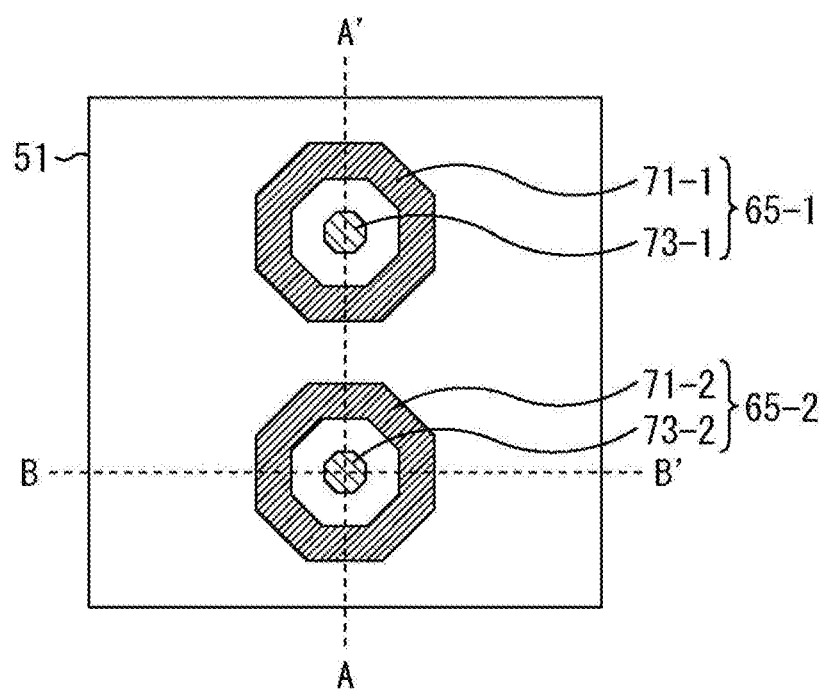
FIG. 3 is a plan view illustrating an example of a planar shape of a signal extraction unit.

FIG. 3 is a plan view illustrating an example of a planar shape of the signal extraction unit 65 in the pixel 51.

In a plan view, the signal extraction unit 65 includes a P+ semiconductor region 73 as a voltage applying unit disposed in a center and an N+ semiconductor region 71 as a charge detection unit, which is disposed to surround the vicinity of the P+ semiconductor region 73. Note that, although outer shapes of the N+ semiconductor region 71 and the P+ semiconductor region 73 are octagonal shapes in FIG. 3, other planar shapes such as square shapes, rectangular shapes, or circular shapes may be used.

In addition, in the pixel 51, the signal extraction units 65-1 and 65-2 are disposed in symmetrical positions with respect to a pixel center.

A line A-A' shown in FIG. 3 shows cross-sectional lines of FIG. 2 and FIG. 10 that will be described later, and a line B-B' shows a cross-sectional line of FIG. 11 that will be described later.

<Example of Equivalent Circuit Configuration of Pixel>

Figure 4:
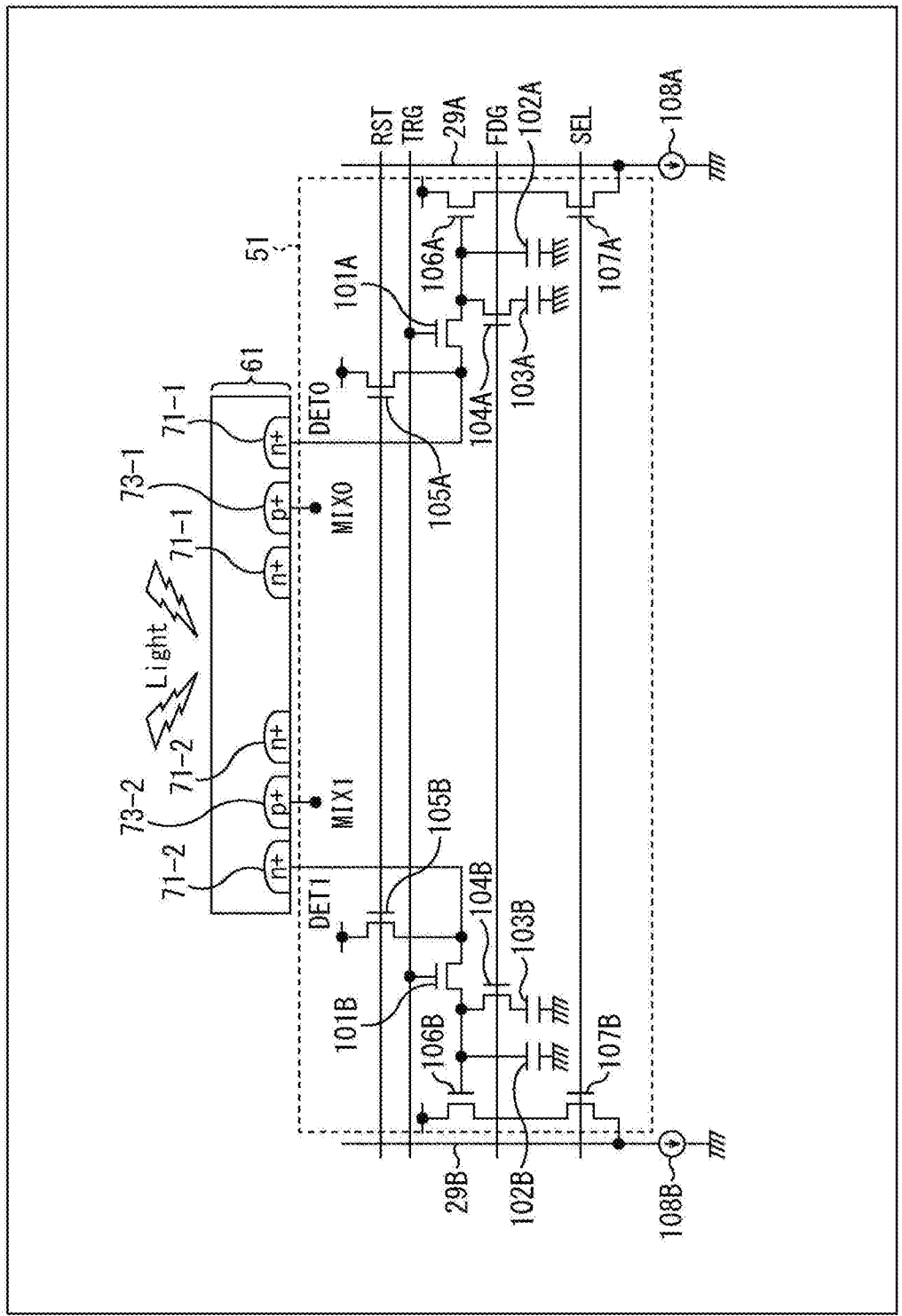
FIG. 4 is an equivalent circuit of the pixel.

FIG. 4 illustrates an equivalent circuit of the pixel 51.

The pixel 51 includes a transmission transistor 101A, an FD 102A, an additional capacitor 103A, a switching transistor 104A, a reset transistor 105A, an amplification transistor 106A, and a selection transistor 107A, with respect to the signal extraction unit 65-1 including the N+ semiconductor region 71-1, the P+ semiconductor region 73-1, and the like.

In addition, the pixel 51 includes a transmission transistor 101B, an FD 102B, an additional capacitor 103B, a switching transistor 104B, a reset transistor 105B, an amplification transistor 106B, and a selection transistor 107B, with respect to the signal extraction unit 65-2 including the N+ semiconductor region 71-2, the P+ semiconductor region 73-2, and the like.

The vertical driving unit 22 applies a predetermined voltage MIX0 (first voltage) to the P+ semiconductor region 73-1 and applies a predetermined voltage MIX1 (second voltage) to the P+ semiconductor region 73-2. For example, one of the voltages MIX0 and MIX1 is 1.5 V and the other is 0 V. The P+ semiconductor regions 73-1 and 73-2 are voltage application portions to which the first voltage or the second voltage is applied.

The N+ semiconductor regions 71-1 and 71-2 are charge detection units that detect and accumulate a charge generated by photoelectric conversion of the light incident on the semiconductor substrate 61.

In a case in which the state of a driving signal TRG supplied to a gate electrode becomes an active state, in response to the driving signal TRG, the state of the transmission transistors 101A becomes a conductive state and thus the charge accumulated in the N+ semiconductor region 71-1 is transmitted to the FD 102A. In a case in which the state of the driving signal TRG supplied to a gate electrode becomes an active state, in response to the driving signal TRG, the state of the transmission transistors 101B becomes a conductive state and thus the charge accumulated in the N+ semiconductor region 71-2 is transmitted to the FD 102B.

The FD 102A temporarily holds the charge supplied from the N+ semiconductor region 71-1. The FD 102B temporarily holds the charge supplied from the N+ semiconductor region 71-2.

In a case in which the state of a driving signal FDG supplied to a gate electrode becomes an active state, in response to the driving signal FDG, the state of the switching transistor 104A becomes a conductive state and thus the additional capacitor 103A is connected to the FD 102A. In a case in which the state of the driving signal FDG supplied to a gate electrode becomes an active state, in response to the driving signal FDG, the state of the switching transistor 104B becomes a conductive state and thus the additional capacitor 103B is connected to the FD 102B.

For example, at a time of a high illuminance in which a light amount of the incident light is large, the vertical driving unit 22 causes the switching transistors 104A and 104B to be in the active state to connect the additional capacitor 103A and the FD 102A with each other and connect the additional capacitor 103B and the FD 102B with each other. Therefore, at the time of the high illuminance, it is possible to accumulate more changes.

On the other hand, at a time of a low illuminance in which the light amount of the incident light is small, the vertical driving unit 22 causes the switching transistors 104A and 104B to be in an inactive state to separate the additional capacitors 103A and 103B from the FDs 102A and 102B, respectively.

In a case in which the state of a driving signal RST supplied to as gate electrode becomes an active state, in response to the driving signal RST, the state of the reset transistor 105A becomes a conductive state an thus a potential of the FD 102A is reset to a predetermined level (reset voltage VDD). In a case in which the state of the driving signal RST supplied to a gate electrode becomes an active state, in response to the driving signal RST, the state of the reset transistor 105B becomes conductive state and thus a potential of the FD 102B is reset to a predetermined level (reset voltage VDD). Note that, when the states of the reset transistors 105A and 105B become the active state, the states of the transmission transistors 101A and 101B also become an active state at the same time.

A source electrode of the amplification transistor 106A is connected to the vertical signal line 29A through the selection transistor 107A, and thus the amplification transistor 106A configures a load MOS of a constant source circuit portion 108A connected to one end of the vertical signal line 29A and a source follower circuit. A source electrode of the amplification transistor 106B is connected to the vertical signal line 29B through the selection transistor 107B, and thus the amplification transistor 106B configures a load MOS of a constant current source circuit portion 108B connected to out end of the vertical signal line 29B and a source follower circuit.

The selection transistor 107A is connected between the source electrode of the amplification transistor 106A and the vertical signal line 29A. In a case in which the state of a selection signal SEL supplied to a gate electrode becomes an active state, in response to the selection signal SEL, the state of the selection transistor 107A becomes a conductive state and thus a pixel signal output from the amplification transistor 106A is output to the vertical signal line 29A.

The selection transistor 107B is connected between the source electrode of the amplification transistor 106B and the vertical signal line 29B. In a case in which the state of the selection signal SEL supplied to a gate electrode becomes an active state, in response to the selection signal SEL, the state of the selection transistor 107B becomes a conductive state and thus a pixel signal output from the amplification transistor 106B is output to the vertical signal line 29B.

For example, the transmission transistors 101A and 101B of the pixel 51, the reset transistor 105A and 105B, the amplification transistors 106A and 106B, and the selection transistors 107A and 107B are controlled by the vertical driving unit 22.

In an equivalent circuit shown in FIG. 4, the additional capacitors 103A and 103B and the switching transistors 104A and 104B that control the connection of the additional capacitors 103A and 103B may be omitted, however, it is possible to secure a high dynamic range by providing the additional capacitor 103 and selectively using the additional capacitor 103 according to the light amount of the incident light.

<Charge Detection Operation of Pixel>

Referring to FIG. 2 again, the detection operation of the pixel 51 will be described.

For example, in a case of attempting to measure the distance to the object by an indirect ToF method, infrared light is emitted from the imaging apparatus provided with the light receiving element 1 toward the object. In addition, in a case in which the infrared light is reflected by die object and returns to the imaging apparatus as reflected light, die light receiving element 1 receives the reflected light (infrared light) incident thereon and performs photoelectric conversion.

At this time, the vertical driving unit 22 drives the pixel 51 to distribute the charge obtained by the photoelectric conversion to die FD 102A connected to die N+ semiconductor region 71-1 that is one charge detection unit (first charge detection unit) and the FD 102B connected to the N+ semiconductor region 71-2 that is the other charge detection unit (second charge detection unit).

More specifically, at a certain timing, the vertical driving unit 22 applies a predetermined voltage to the two P+ semiconductor regions 73 through the voltage applying wiring 93 or the like. For example, the vertical driving unit 22 applies a voltage of 1.5 V to the P+ semiconductor region 73-1 and applies a voltage of 0 V to the P+ semiconductor region 73-2.

Then, an electric field is generated between the two P+ semiconductor regions 73 in the semiconductor substrate 61, and a current Hows from the P+ semiconductor region 73-1 to the P+ semiconductor region 73-2. In this case, a hole in the semiconductor substrate 61 moves toward the P+ semiconductor region 73-2, and an electron moves toward the P+ semiconductor region 73-1.

Therefore, in such a state, in a case in which the infrared light (reflected light) from the outside enters the inside of the semiconductor substrate 61 through the on-chip lens 62, and the photoelectric conversion is performed on the infrared light in the semiconductor substrate 61 to convert the infrared light into pairs of electrons and holes, the obtained electrons are guided toward the P+ semiconductor region 73-1 by the electric field between the P+ semiconductor regions 73, and are moved to the N+ semiconductor region 71-1.

In this case, the electrons generated by the photoelectric conversion are used as the signal carrier for detecting the signal according to an amount of the infrared light incident on the pixels 51, that is, a reception light amount of the infrared light.

Therefore, in the N+ semiconductor region 71-1, a charge corresponding to electrons that have moved to the N+ semiconductor region 71-1 is detected and accumulated in the FD 102A. In a case in which the switching transistor 104A is in the active state, the charge is also accumulated in the additional capacitor 103A. In a case in which the pixel 51 is selected, a signal corresponding to the charge is output to the column processing unit 23 through the vertical signal 29A or the like.

In addition, a process such as the AD conversion process in the column process unit 23 is implemented on the read signal, and a pixel signal obtained as result is supplied to the signal processing unit 26. The pixel signal is signal indicating an amount of the charges detected in the N+ semiconductor region 71-1, in other words, a signal indicating the amount of the infrared light received by the pixel 51.

Note that, at this time, similarly to a case of the N+ semiconductor region 71-1, a pixel signal according to the charge detected in the N+ semiconductor region 71-2 may also be used for the distance measurement as appropriate.

In addition, at the next timing, voltages are applied to the two P+ semiconductor regions 73 by the vertical driving unit 22 so that an electric field of a direction opposite to a direction of an electric field generated in the semiconductor substrate 61 until that point in time is generated. Specifically, for example, a voltage of 0 V is applied to the P+ semiconductor region 73-1, and the voltage of 1.5 V is applied to the P+ semiconductor material region 73-2.

Therefore, an electric field is generated between the two P+ semiconductor regions 73 in the semiconductor substrate 61, and a current flows from the P+ semiconductor region 73-2 to the P+ semiconductor region 73-1.

In such a state, in a case in which the infrared light (reflected light) from the outside enters the inside of the semiconductor substrate 61 through the on-chip lens 62, and the photoelectric conversion is performed on the infrared light in the semiconductor substrate 61 to convert the infrared light into a pair of the electron and the hole, the obtained electron is directed in the direction of P+ semiconductor region 73-2 by the electric field between the P+ semiconductor regions 73, and is moved into tire N+ semiconductor region 71-2.

Therefore, in the N+ semiconductor region 71-2, a charge corresponding to electrons that have moved to the N+ semiconductor region 71-2 is detected and accumulated in the FD 102B. In a case in which the switching transistor 104B is in the active state, the charge is also accumulated in the additional capacitor 103A. In a case in which the pixel 51 is selected, a signal corresponding to the charge is output to the column processing unit 23 through the vertical signal line 29B or the like.

In addition, a process such as the AD conversion process in the column processing unit 23 is implemented on the read signal, and a pixel signal obtained as a result is supplied to the signal processing unit 26. The pixel signal is a signal indicating an amount of the charges detected in the N+ semiconductor region 71-2, in other words, a signal indicating the light amount of the infrared light received by the pixel 51.

Note that, at this time, a pixel signal according to the electron detected in the N+ semiconductor region 71-1 is also able to be used for appropriate distance measurement, similarly to a case of the N+ semiconductor region 71-2.

As described above, in a case in which the pixel signals obtained by the photoelectric conversion of periods different from each other in the same pixel 51 are obtained, the signal processing unit 26 calculates distance information indicating the distance to the object on the basis of the pixel signals and outputs the distance information to the subsequent stage.

A method of distributing the signal carriers to the N+ semiconductor regions 71 different from each other and calculating the distance information on the basis of the signal according to the signal carrier as described above is referred to as an indirect ToF method.

Here, the signal extraction unit 65 in which the reading of the signal according to the charge (electron) that is obtained by the photoelectric conversion is to be performed, that is, the signal extraction unit 65 in which the charge obtained by the photoelectric conversion is to be detected will be referred to as an active tap.

On the contrary, basically, the signal extraction unit 65 in which the reading of the signal according to the charge that is obtained by the photoelectric conversion is not to be performed, that is, the signal extraction unit 65 that is not the active tap will be referred to as an inactive tap.

In the above example, the signal extraction unit 65 in which a voltage of 1.5 V is applied to the P+ semiconductor region 73 is the active tap, and the signal extraction unit 65 in which a voltage of 0 V is applied to the P+ semiconductor region 73 is the inactive tap.

In the CAPD sensor, there is a value referred to as contrast between active and inactive tap (Cmod) that is an index of distance measurement accuracy. Cmod is calculated by the following Math. (1). In Math. (1), I0 is a signal detected in one of the two charge detection units (P+ semiconductor regions 73), and I1 is a signal detected in the other.

$$C\bmod =\{[I0-I1]/(I0+I1)\}\times 100 \quad (1)$$

Cmod indicates that what % of the charge is able to be detected in the N+ semiconductor region 71 of the signal extraction unit 65 that is the active lap, among the charges generated by the photoelectric conversion of the incident infrared light, that is, an index indicating whether or not it is possible to extract the signal according to the charge, and indicates the charge separation efficiency.

For example, in a case in which the infrared light incident from the outside is incident on a region of the inactive tap and the photoelectric conversion is performed in the inactive tap, the is a high likelihood that the electron that is the signal carrier generated by the photoelectric conversion will move to the N+ semiconductor region 71 in the inactive tap. Therefore, a charge of a part of the electron obtained by the photoelectric conversion is not detected in the semiconductor region 71 in the active tap, and Cmod, that is, the charge separation efficiency, is reduced.

Therefore, in the pixel 51, the infrared light is condensed in the vicinity of the central portion of the pixel 51 positioned at substantially the same distance from the two signal extraction units 65, so that a possibility that the photoelectric conversion will be performed on the infrared light incident from the outside in the region of the inactive tap is reduced. Thus, the charge separation efficiency is improved. In addition, in the pixel 51, it is also possible to improve a modulation contrast. In other words, it is possible to easily guide the electron obtained by the photoelectric conversion to the N+ semiconductor region 71 in the active tap.

<Effect of Light Receiving Element 1>

According to the above light receiving element 1, the following effect can be obtained.

That is, first, since the light receiving element 1 is a rear irradiation type, it is possible to maximize quantum efficiency (QE)×aperture ratio (fill factor (FF)), and it is possible to improve the distance measurement characteristic by the light receiving element 1.

Figure 5:
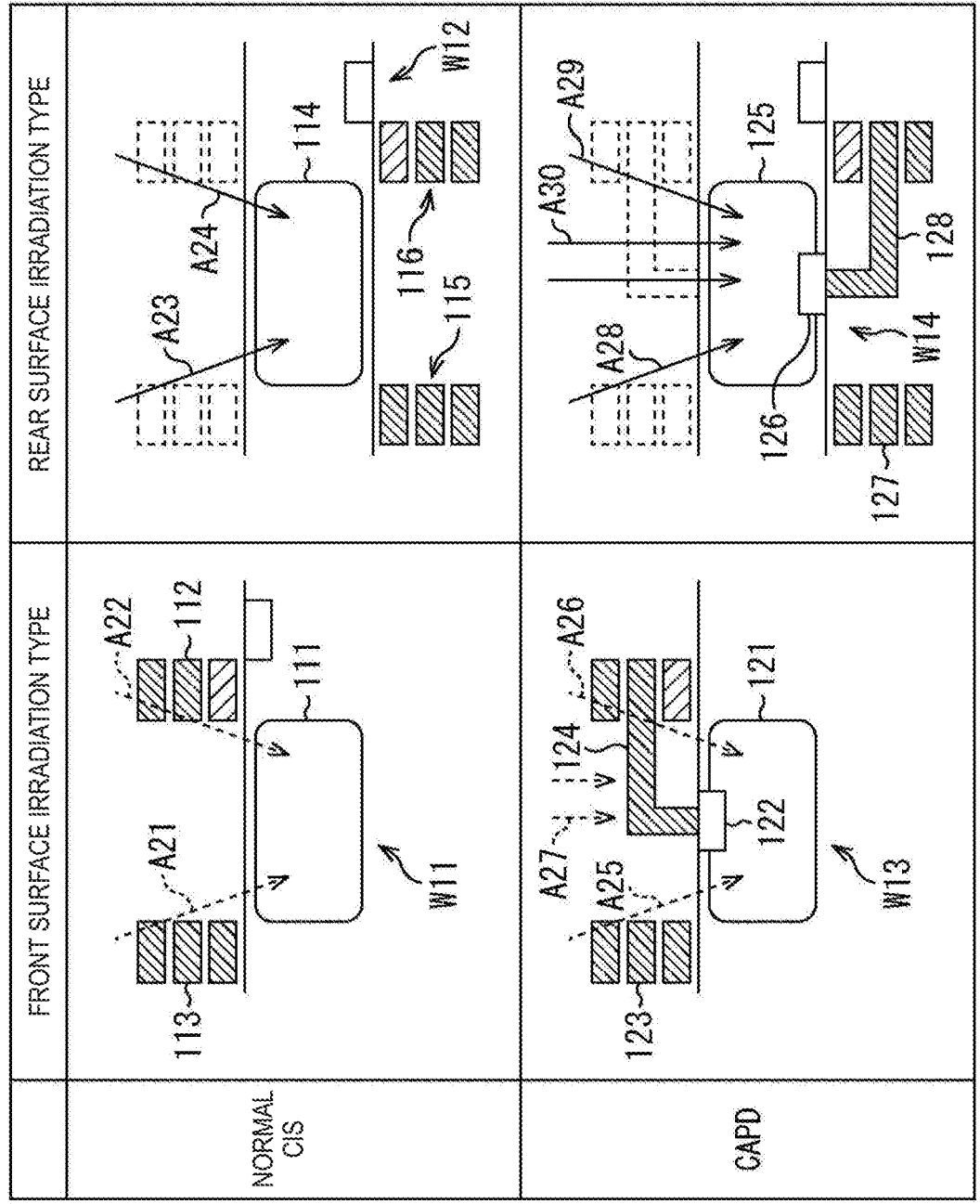
FIG. 5 is a diagram for explaining an effect of the light receiving element of FIG. 1.

For example, as shown by an arrow W11 of FIG. 5, an image sensor (CIS) of an ordinary surface irradiation type has a structure in which a wiring 112 or a wiring 113 is formed on a light incidence surface side on which light from the outside of a PD 111 that is the photoelectric conversion unit is incident.

Therefore, for example, as shown by an arrow A21 or an arrow A22, some of light that is obliquely incident on the PD 111 with a certain angle may be shielded by the wiring 112 or the wiring 113 and thus may not be incident on the PD 111.

On the other hand, for example, as shown by an arrow W12, an image sensor (CIS) of the rear surface irradiation type has a structure in which a wiring 115 or a wiring 116 is formed on an upper surface of a side opposite to the light incidence surface side on which light from the outside of a PD 114 that is the photoelectric conversion unit is incident.

Therefore, it is possible to ensure a sufficient aperture ratio as compared with a case of the front surface irradiation type. That is, for example, as indicated by an arrow A23 or an arrow A24, light that is obliquely incident on the PD 114 with a certain angle is incident on the PD 114 without being shielded by the wiring. Therefore, it is possible to improve the sensitivity of the pixel by receiving more light.

The effect of improving, the pixel sensitivity obtained by such a rear surface irradiation type is also able to be obtained in the light receiving element 1 that is the CAPD sensor of the rear surface irradiation type.

In addition, for example, in the CAPD sensor of the front surface irradiation type, as shown by an arrow W13, a signal extraction unit 122 referred to as a tap, more specifically, the P+ semiconductor region or the N+ semiconductor region of the tap, is formed on the light incident surface side on which the light is incident from the outside of an inside of a PD 121 that is the photoelectric conversion unit. In addition, the CAPD sensor of the front surface irradiation type has a structure in which a wiring 123 or a wiring 124 such as a contact and a metal connected to the signal extraction unit 122 is formed on the light incident surface side.

Therefore, for example, as shown by an arrow A25 or an arrow A26, some of light that is obliquely incident on the PD 121 with a certain angle may be shielded by the wiring 123 or the like and thus may not be incident on the PD 121. In addition, as shown by an arrow A27, light incident perpendicularly to the PD 121 may also be shielded by the wiring 124 and may not be incident on the PD 121.

On the other hand, for example, as shown by an arrow W14, the CAPD sensor of the rear surface irradiation type has a structure in which a signal extraction unit 126 is formed in a portion of a side opposite to the light incidence surface on which light from die outside of a PD 125 dial is die photoelectric conversion unit is incident. In addition, a wiring 127 or a wiring 128 such as a contact and a metal connected to the signal extraction unit 126 is formed on an upper surface of the side opposite to the light incident surface of the PD 125.

Here, the PD 125 corresponds to the semiconductor substrate 61 shown in FIG. 2, and the signal extraction unit 126 corresponds to the signal extraction unit 65 shown in FIG. 2.

In the CAPD sensor of the rear irradiation type of such a structure, it is possible to secure a sufficient aperture ratio as compared with a case of the front surface irradiation type. Therefore, it is possible to maximize the quantum efficiency (QE)×the aperture ratio (FF), and it is possible to improve the distance measurement characteristic.

That is, for example, as indicated by an arrow A28 or an arrow A29, light that is obliquely incident on the PD 125 with a certain angle is incident on die PD 125 without being shielded by the wiring. Similarly, as shown by an arrow A30, light incident perpendicularly to the PD 125 is also incident on the PD 125 without being shield by the wiring or the like.

As described above, in the CAPD sensor of the rear surface irradiation type, it is also possible to receive light reflected by the wiring or the like that is connected to the signal extraction unit (tap) in the front surface irradiation type, in addition to the light that is incident with a certain angle and the light incident perpendicularly to the PD 125. Therefore, it is possible to improve the sensitivity of the pixel by receiving more light, in other words, it is possible to maximize the quantum efficiency (QE)×the aperture ratio (FF), and as a result, it is possible to improve the distance measurement characteristic.

In particular, in a case in which the tap is disposed in the vicinity of the center of the pixels rather than a pixel outer edge, in the CAPD sensor of the front surface irradiation type, it is difficult to secure a sufficient aperture ratio and the sensitivity of the pixel is reduced. However, in the light receiving element 1 that is the CAPD sensor of the rear surface irradiation type, it is possible to secure a sufficient aperture ratio regardless of a disposition position of the tap, and it is possible to improve the sensitivity of the pixel.

In addition, in the light receiving element 1 of the rear surface irradiation type, since the signal extraction unit is formed in the vicinity of the surface of the side opposite to the light incident surface on which the infrared light from the outside is incident in the semiconductor substrate 61, it is possible to reduce generation of the photoelectric conversion of the infrared light in a region of the inactive tap. Therefore, it is possible to improve Cmod, that is, charge separation efficiency.

Figure 6:
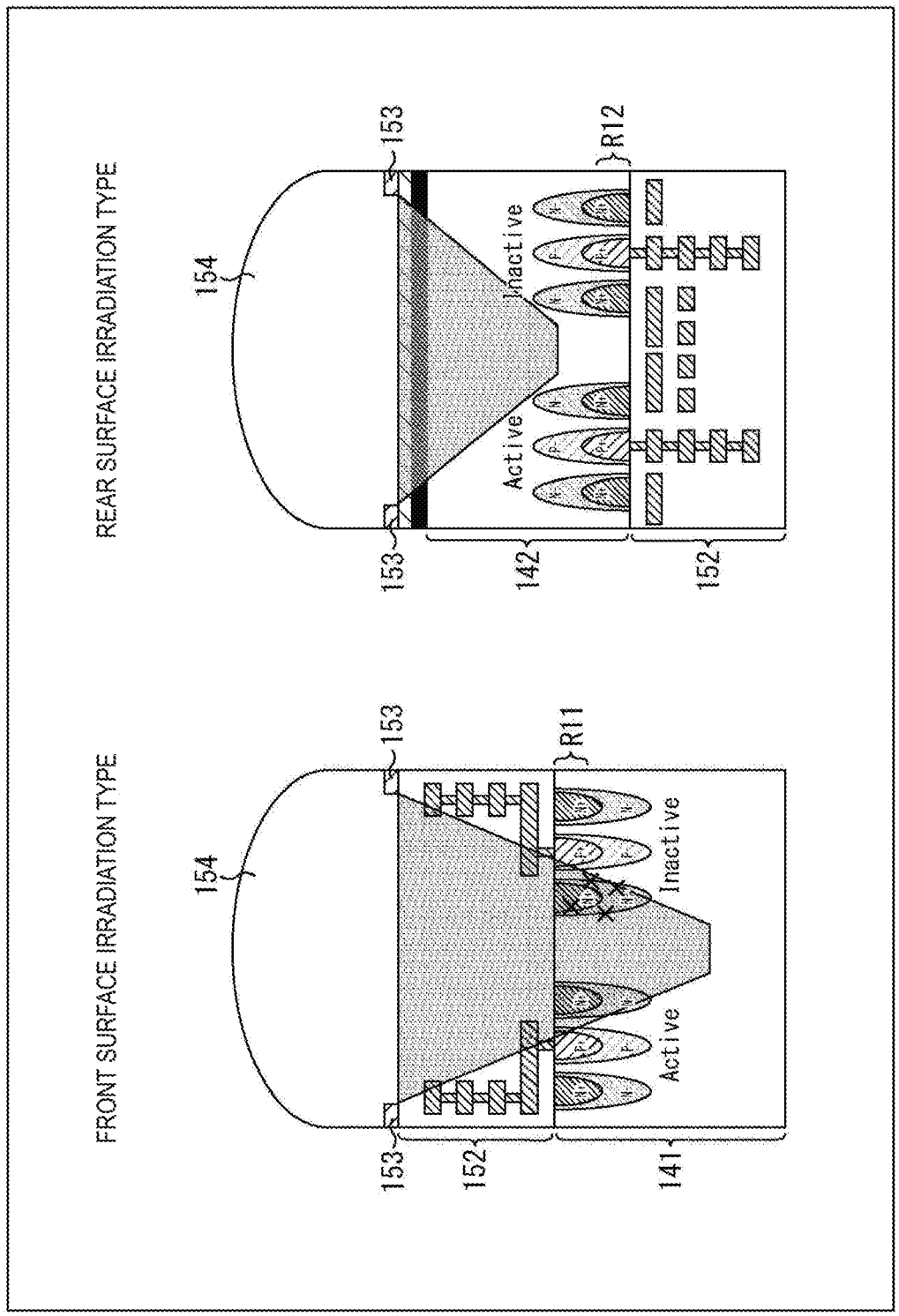
FIG. 6 is a diagram for explaining an effect of the light receiving element of FIG. 1.

FIG. 6 illustrates cross-sectional views of the pixels of the CAPD sensors of the front surface irradiation type and the rear irradiation type.

In the CAPD sensor of the front surface irradiation type on a left side of FIG. 6, in the figure, an upper side of the semiconductor substrate 141 is the light incident surface, and a wiring layer 152 including wirings of a plurality of layers, an inter-pixel light shielding portion 153, and an on-chip lens 154 are stacked on the light incident surface side of the semiconductor substrate 141.

In the CAPD sensor of the rear surface irradiation type on a right side of FIG. 6, in the figure, a wiring layer 152 including wirings of a plurality of layers is formed on a lower side of a substrate 142 on a side opposite to the light incident surface, the inter-pixel light shielding portion 153 and the on-chip lens 154 are stacked on the upper side of the substrate 142 that is the side of the light incident surface.

Note that, in FIG. 6, a gray trapezoidal shape shows a region where a light intensity is strong by condensing the infrared light by the on-chip lens 154.

For example, in the CAPD sensor of the front surface irradiation type, there is a region R11 where the inactive tap and the active tap are present on the light incident surface side of the semiconductor substrate 141. Therefore, in a case in which there are many components directly incident on the inactive tap and the photoelectric conversion is performed in the region of the inactive tap, a signal carrier obtained by the photoelectric conversion is not detected in die N+ semiconductor region of the active tap.

In the CAPD sensor of die front surface irradiation type, since the intensity of the infrared light is strong in the region R11 in the vicinity of the light incident surface of the semiconductor substrate 141, a probability that die photoelectric conversion of the infrared light is performed in the region R11 increases. That is, since the light amount of the infrared light incident on the vicinity of the inactive tap is large, the number of signal carriers that are not able to be detected by the active tap increases, and the charge separation efficiency is reduced.

On the other hand, in the CAPD sensor of the rear surface irradiation type, there is a region R12 where the inactive tap and the active tap are present at a position far from the light incident surface of die substrate 142, that is, the position of the vicinity of the surface of the side opposite to the light incident surface side. The substrate 142 corresponds to the semiconductor substrate 61 shown in FIG. 2.

In this example, since the region R12 is present in a portion of the surface opposite to the light incident surface side of the substrate 142 and the region R12 is present at the position far from the light incident surface, in the vicinity of the region R12, the intensity of the incident infrared light becomes relatively weak.

The signal carrier obtained by the photoelectric conversion in the region where the intensity of the infrared light is strong, such as in the vicinity of the center of the substrate 142 or in the vicinity of the incident surface, is guided to the active tap by the electric field generated in the substrate 142 and is detected in the N+ semiconductor region of the active tap.

On the other hand, since the intensity of the incident infrared light is relatively weak in the vicinity of the region R12 including the inactive tap, a probability that the photoelectric conversion of the infrared light is performed in the region R12 is low. That is, the light amount of the infrared light incident on the vicinity of the inactive taps is small, the number of the signal carries (electrons) generated by the photoelectric conversion in the vicinity of the inactive lap and moved to the N+ semiconductor region of the inactive tap is reduced, and it is possible to improve the charge separation efficiency. As a result, it is possible to enhance the distance measurement characteristic.

Furthermore, in the light receiving element 1 of the rear surface irradiation type, since it is possible to realize thinning of the semiconductor substrate 61, it is possible to improve extraction efficiency of the electron (charge) that is the signal carrier.

Figure 7:
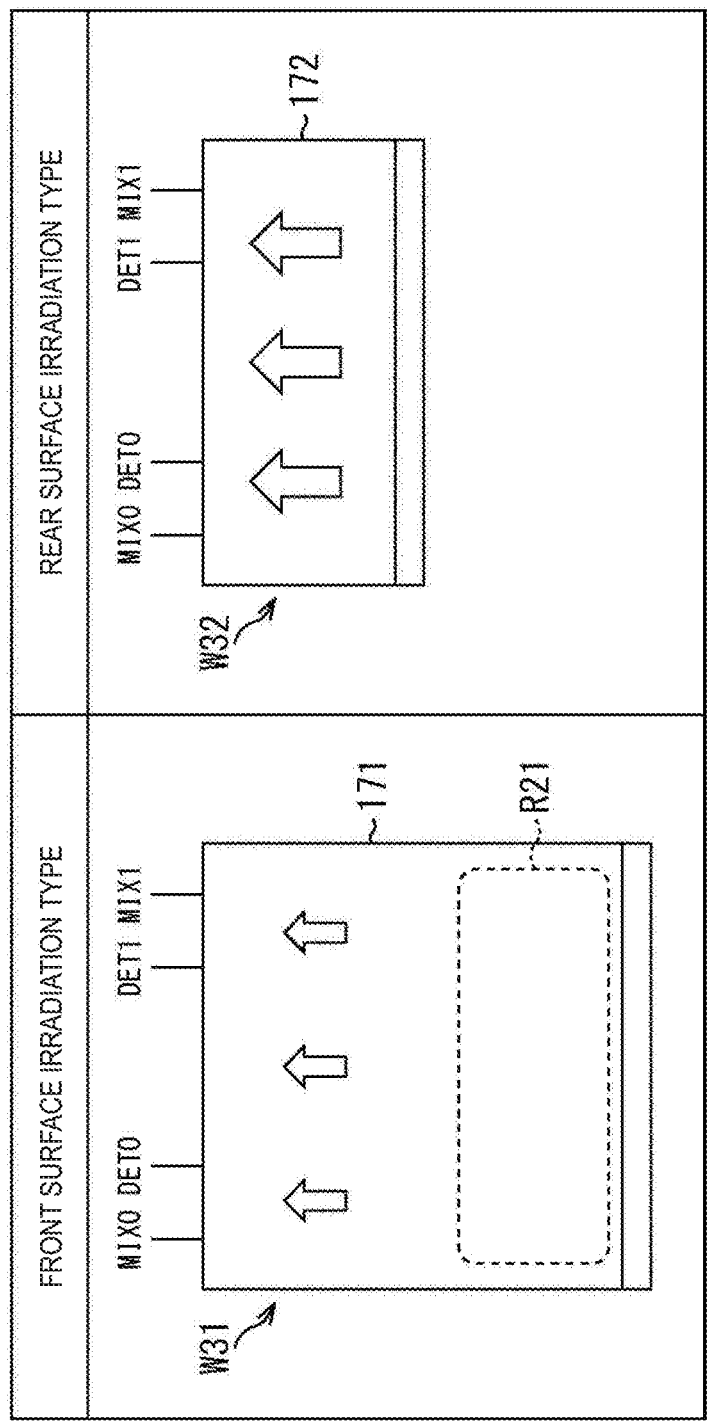
FIG. 7 is a diagram for explaining an effect of the light receiving element of FIG. 1.

For example, in the CAPD sensor of the front surface irradiation type, since it is not possible to secure the aperture ratio sufficiently, as shown by an arrow W31 of FIG. 7, in order to secure higher quantum efficiency and suppress a reduction in quantum efficiency×aperture ratio, a substrate 171 is desired to be thick to some extent.

Therefore, a slope of a potential becomes gentle in a region in the vicinity of the surface opposite to the light incident surface in the substrate 171, for example, in the region R21 of FIG. 7, and the electric field of a direction substantially perpendicular to the substrate 171 becomes weak. In this case, since a moving speed of the signal carrier is delayed, a time desired from when the photoelectric conversion is performed until the signal carrier is detected in the N+ semiconductor region of the active tap becomes long. Note that, in FIG. 7, an arrow in the substrate 171 shows the electric field of a direction perpendicular to the substrate 171 in the substrate 171.

In addition, in a case in which the substrate 171 is thick, a movement distance of the signal carrier from the position far from the active tap in the substrate 171 to the N+ semiconductor region in the active tap becomes long. Therefore, at the position far from the active tap, a time desired from when the photoelectric conversion is performed until the signal carrier is detected in the N+ semiconductor region of the active tap becomes longer.

Figure 8:
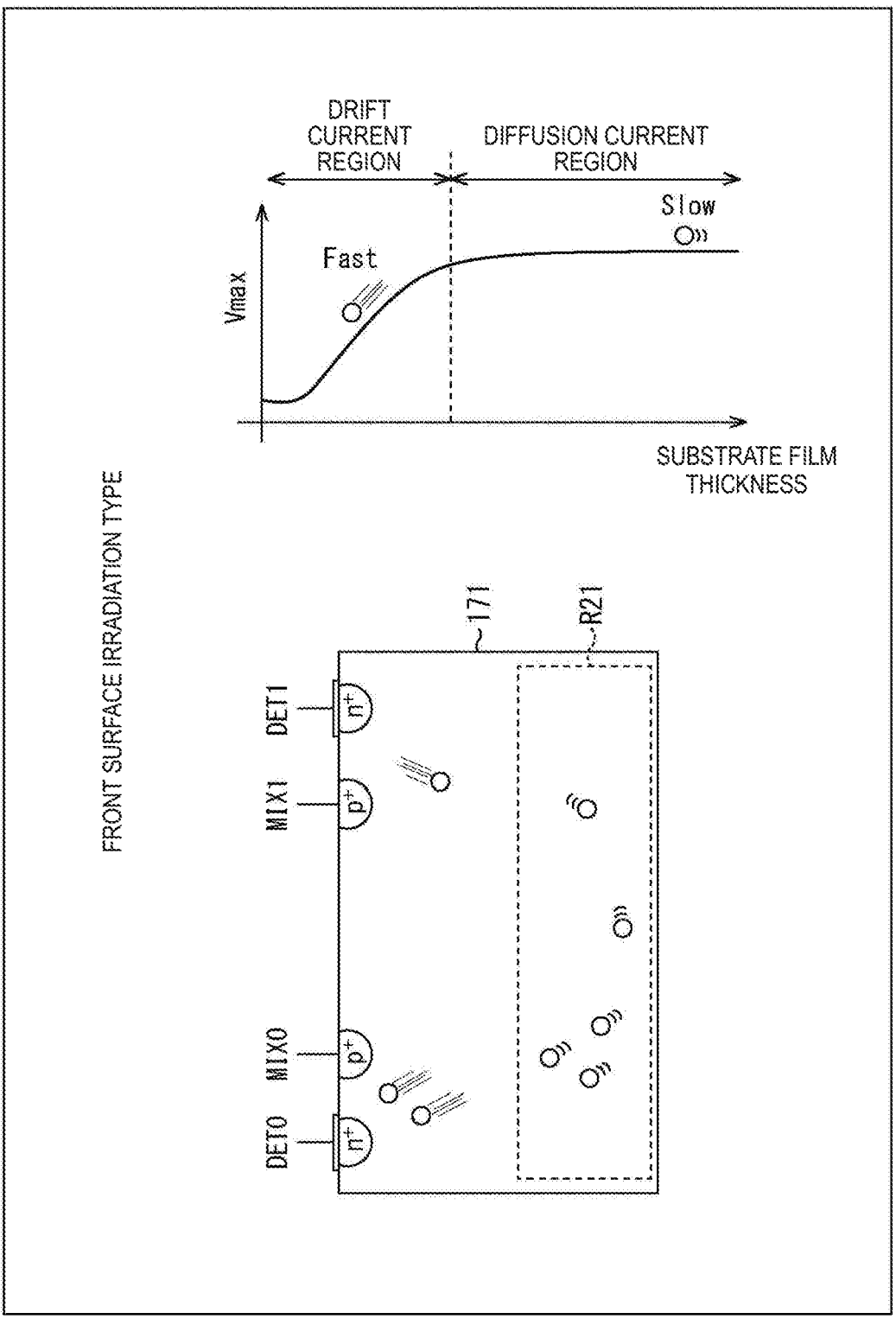
FIG. 8 is a diagram for explaining an effect of the light receiving element of FIG. 1.

FIG. 8 illustrates a relationship between a position in a thickness direction of the substrate 171 and the moving speed of the signal carrier. The region R21 corresponds to a diffusion current region.

As described above, in a case in which the substrate 171 becomes thick, for example, when a driving frequency is high, that is, when switching between activation and inactivation of the tap (signal extraction unit) is performed at a high speed, it is difficult to completely draw the electron generated at the position far from the active tap, such as the region R21, into the N+ semiconductor region of the active tap. That is, in a case in which a time during which the tap is active is short, the electron (charge) generated in the region R21 or the like may not be detected in the N+ semiconductor region of the active tap, and the extraction efficiency of the electron is reduced.

On the other hand, in the CAPD sensor of the rear surface irradiation type, since it is possible to secure a sufficient aperture ratio, for example, as shown in an arrow W32 of FIG. 7, even though the substrate 172 is thinned, it is possible to secure the sufficient quantum efficiency×aperture rate. Here, the substrate 172 corresponds to the semiconductor substrate 61 of FIG. 2, and the arrow inside the substrate 172 shows the electric field of a direction perpendicular to the substrate 172.

Figure 9:
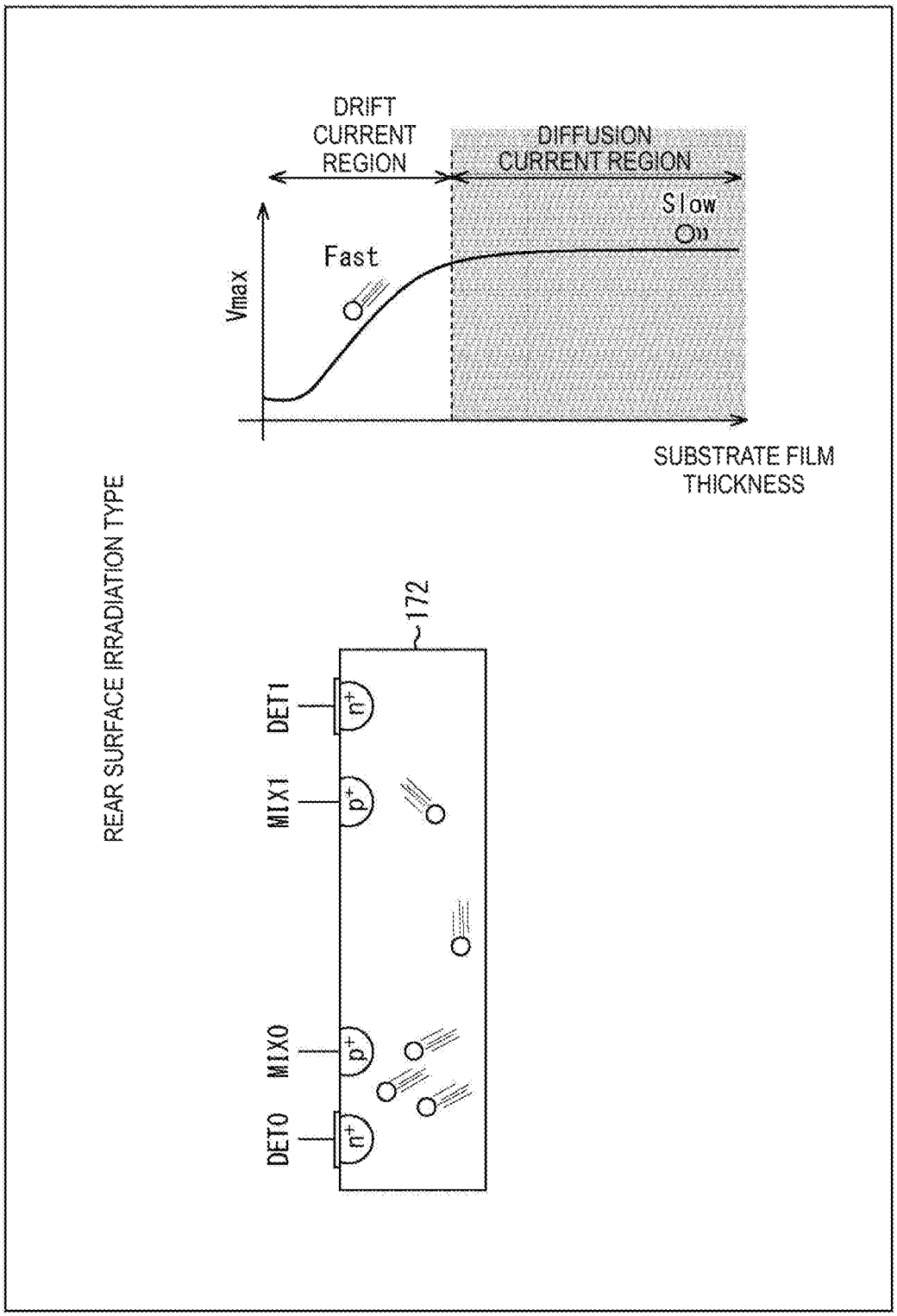
FIG. 9 is a diagram for explaining an effect of the light receiving element of FIG. 1.

FIG. 9 illustrates a relationship between the position of a thickness direction of the substrate 172 and the moving speed of the signal carrier.

As described above, in a case in which the thickness of the substrate 172 of the direction perpendicular to the substrate 172 is reduced, the electric field of the direction substantially perpendicular to the substrate 172 becomes strong, only an electron (charge) only in a drift current region where the moving speed of the signal carrier is fast is used, and an electron in a diffusion current region where the moving speed of the signal carrier is slow is not used. The time desired from when the photoelectric conversion is performed until die signal carrier is detected in the N+ semiconductor region of the active tap becomes short, by using only the electron (charge) only in the drift current region. In addition, in a case in which the thickness of the substrate 172 is reduced, the movement distance to the N+ semiconductor region in die active tap of the signal carrier also becomes short.

Therefore, in the CAPD sensor of the rear surface irradiation type, even though the driving frequency is high, it is possible to sufficiently draw the signal carries (elections) generated in each region in the substrate 172 into the N+ semiconductor region of the active tap, and it is possible to improve the extraction efficiency of the electron.

In addition, it is possible to secure sufficient extraction efficiency of the electron even at a high driving frequency by reducing the thickness of the substrate 172, and it is possible to improve high speed driving resistance.

In particular, in the CAPD sensor of the rear surface irradiation type, since it is possible to directly apply the voltage to the substrate 172, that is, the semiconductor substrate 61, a response speed of the switching between the activation and the inactivation of the tap is fast, and it is possible to perform driving at a high driving frequency. In addition, since it is possible to directly apply to the semiconductor substrate 61, a region that is able to be modulated in the semiconductor substrate 61 is widened.

Furthermore, in the light receiving element 1 (CAPD sensor) of the rear surface irradiation type, since it is possible to obtain a sufficient aperture ratio, it is possible to miniaturize the pixel by that amount, and it is possible to improve miniaturization resistance of the pixel.

In addition, in the light receiving element 1, by causing the light receiving element 1 to be the rear irradiation type, liberalization of back end of line (BEOL) capacity design becomes possible, and thus it is possible to improve a degree of design freedom of a saturation signal amount (Qs).

<Cross-Sectional View of Plurality of Pixels>

Figure 10:
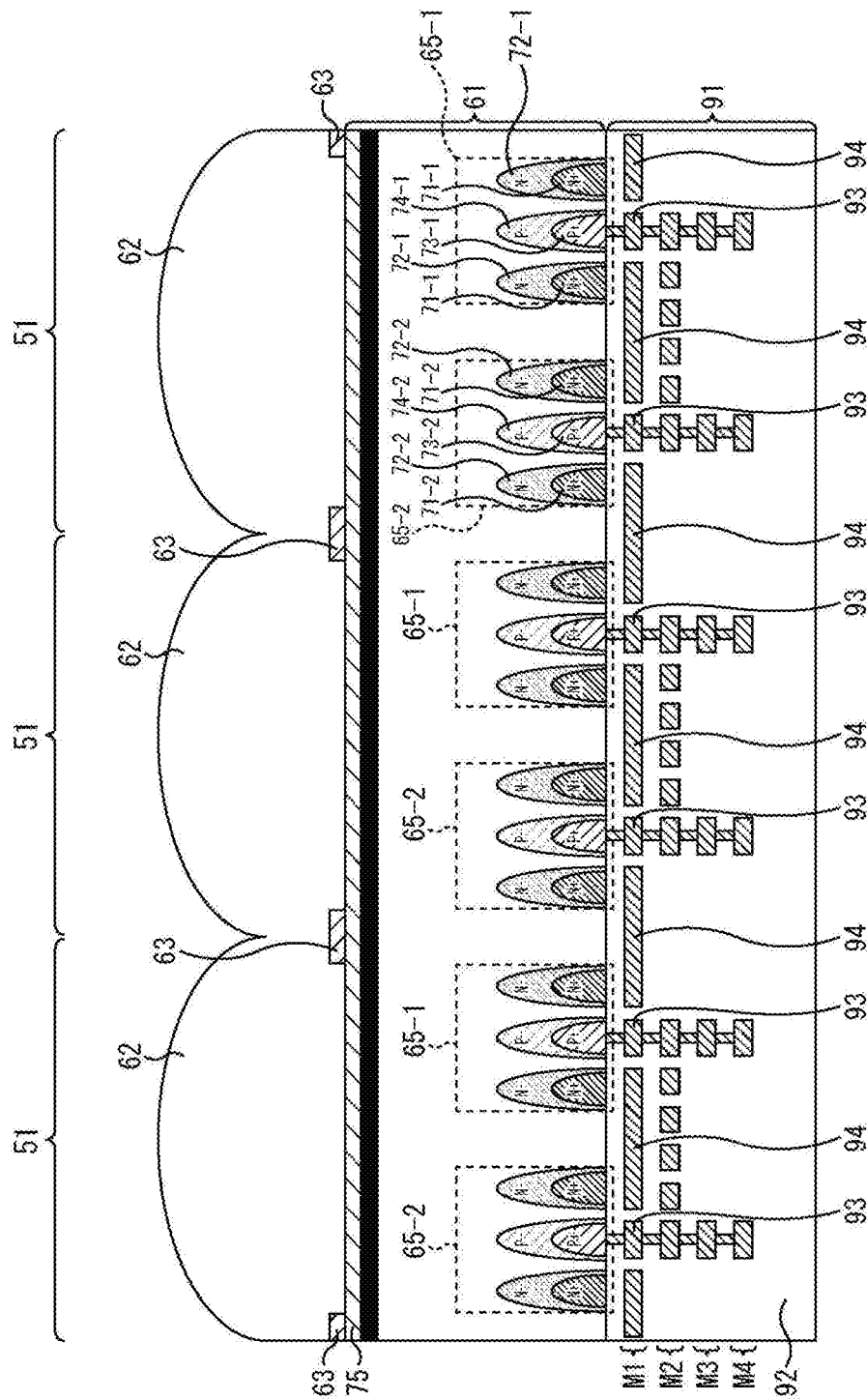
FIG. 10 is a cross-sectional view of a plurality of pixels of the light receiving element of FIG. 1.

FIGS. 10 and 11 illustrate cross-sectional views of a state in which a plurality (three) of the above-described pixels 51 is arranged.

FIG. 10 illustrates a cross-sectional view of a cross-sectional direction the same as that of the cross-sectional view of FIG. 2 and corresponding to the line A-A' of FIG. 3, and FIG. 11 illustrates a cross-sectional view corresponding to the line B-B' of FIG. 3.

Since FIG. 10 is the same as the cross-sectional view of FIG. 2, the description thereof will be omitted.

With respect to FIG. 11, portions different from FIG. 10 will be described.

In FIG. 11, a pixel transistor Tr is formed in a pixel boundary region of an interface portion between a multilayer wiring layer 91 and the semiconductor substrate 61. The pixel transistor Tr is any of the transmission transistor 101, the switching transistor 104, the reset transistor 105, the amplification transistor 106, or the selection transistor 107 shown in FIG. 4.

In addition, in addition to the voltage applying wiring 93 for applying a predetermined voltage to the P+ semiconductor region 73 as the voltage applying unit, a signal extraction wiring 95 connected to a pan of the N+ semiconductor region 71 that is the charge detection unit is formed on the metal film M1. The signal extraction wiring 95 transmits the charge detected in the N+ semiconductor region 71 to the FD 102.

As shown in FIG. 11, the voltage applying wiring 93 of the metal film M1 is electrically connected to one of a wiring 96-1 or 96-2 of the metal film M4 through a via. The wiring 96-1 of the metal film M4 is connected to a wiring 97-1 of the metal film M5 at a predetermined location (location that is not shown in FIG. 11) through a via, and the wiring 96-2 of the metal film M4 is connected to a wiring 97-2 of the metal film M5 at a predetermined location through a via.

Figure 12:
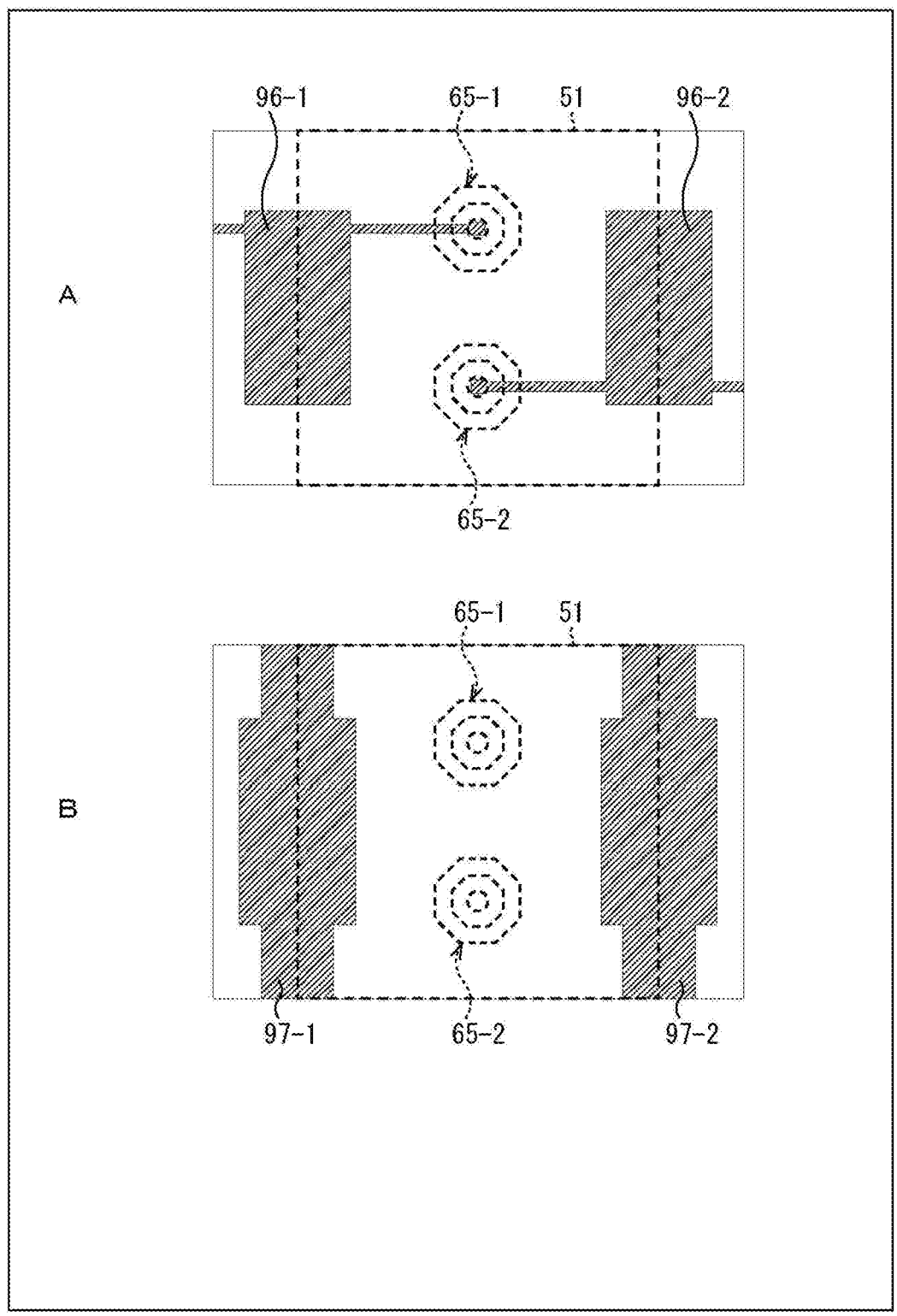
FIG. 12 is a plan view of a metal film in a multilayer wiring layer.

A of FIG. 12 illustrates a plan view of the metal film M4, and B of FIG. 12 illustrates a plan view of the metal film M5.

In A and B of FIG. 12, a region of the pixel 51 and a region of the signal extraction units 65-1 and 65-2 having the octagonal shape shown in FIG. 3 is shown by a dashed line. In A and B of FIG. 12, a vertical direction of the figure is a vertical direction of the pixel array unit 21 and a horizontal direction of the figure is a horizontal direction of the pixel array unit 21.

The P+ semiconductor region 73 that is the voltage applying unit of the signal extraction unit 65-1 is connected to the wiring 96-1 of the metal film M4 through a via, and the wiring 96-1 is connected to the wiring 97-1 of the metal film M5 through a via or the like in a predetermined region where wiring regions overlap.

Similarly, the P+ semiconductor region 73 that is the voltage applying unit of the signal extraction unit 65-2 is connected to the wiring 96-2 of the metal film M4 through a via, and the wiring 96-2 is connected to the wiring 97-2 of the metal film M5 through a via or the like in a predetermined region where wiring regions overlap.

A predetermined voltage (voltage MIX 0 or MIX 1) from a driving unit of a peripheral circuit unit of a periphery of the pixel array unit 21 is transmitted to the wirings 97-1 and 97-2 of the metal film M5 and is supplied to the wirings 96-1 and 96-2 of the metal film M4. In addition, the predetermined voltage is applied from the wirings 96-1 and 96-2 of the metal film M4 to the voltage applying wiring 93 of the metal film M1 through the metal films M3 and M2, and is supplied to the P+ semiconductor region 73 that is the voltage applying unit.

2. Necessity of Enhancement of Basic Pixel Structure

The basic structure of the light receiving element to which an embodiment of the present technology is applied has been described above. Hereinafter, a configuration of the light receiving element to which an embodiment of the present technology is applied will be described with respect to the light receiving element having the basic structure described above.

The light receiving element to which an embodiment of the present technology is applied becomes a light receiving element in which a part of a structure of the multilayer wiring layer 91 of the pixel 51 is improved with respect to the basic structure of the light receiving element 1 described above. Hereinafter, a pixel structure in which an embodiment of the present technology is applied to the pixel 51 of the light receiving element 1 to improve the pixel structure will be described as a pixel 201. Note that, portions corresponding to the pixel 51 of FIG. 2 are denoted by the same reference numerals, and the description thereof will be omitted as appropriate.

As described with reference to FIG. 2 and the like, in the structure of the pixel 51 of the light receiving element 1 described above, a structure in which light passing through the semiconductor substrate 61 that is a photoelectric conversion region is reflected toward the semiconductor substrate 61 to improve the efficiency of the light contributing the photoelectric conversion by providing the reflection member 94 that is a member that reflects incident light on the metal film M1 closest to the semiconductor substrate 61 in the multilayer wiring layer 91 has been adopted.

In the structure of the pixel 51, in a case in which photoelectric conversion efficiency in the vicinity of the charge detection unit is also increased due to an addition of a reflection structure using the reflection member 94 and a charge that does not follow voltage switching is increased, there is a possibility that Cmod representing the signal contrast of the CAPD sensor may be reduced, improvement effect may be reduced.

Therefore, hereinafter, a pixel structure improving distance measurement accuracy by suppressing a charge detected in the charge detection unit without following the voltage switching in the vicinity of the charge detection unit while keeping the characteristic of the basic structure of the light receiving element 1 is proposed.

3. First Embodiment of Pixel

Figure 13:
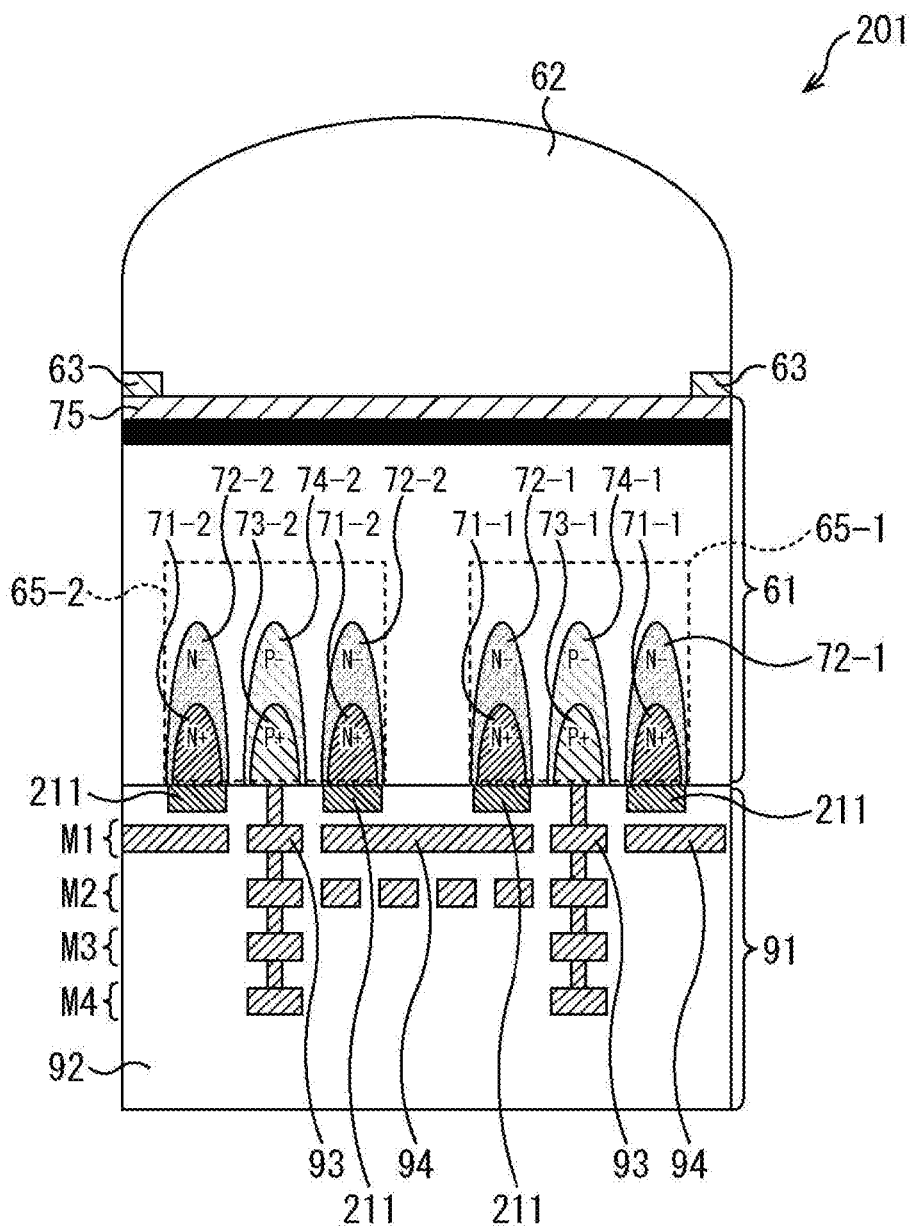
FIG. 13 is a cross-sectional view illustrating a pixel structure of a first embodiment of a pixel to which the present technology is applied.

FIG. 13 is a cross-sectional view illustrating a pixel structure of a first embodiment of a pixel to which the present technology is applied.

FIG. 13 illustrates a cross-sectional view of a cross-sectional direction the same as that of the pixel 51 shown in FIG. 2. The same applies to FIGS. 14 to 27 that will be described below.

In comparison with the pixel 51 of FIG. 2, the pixel 201 according to live first embodiment of FIG. 13 has a difference that a reflection suppressing film 211 including polysilicon is newly formed between a surface side interface of the semiconductor substrate 61 on which the multilayer wiring layer 91 is formed and the wiring layer of the metal film M1. More specifically, the reflection suppressing film 211 is formed on a lower side of the N+ semiconductor region 71 that is the charge detection unit in FIG. 13, in other words, between the N+ semiconductor region 71 and the wiring layer of the metal film M1, and for example, a planar surface region where the reflection suppressing film 211 is formed has an octagonal shape similarly to the N+ semiconductor region 71 that is the charge detection unit.

The reflection suppressing film 211 including polysilicon is able to be formed by the same process as the pixel transistor Tr shown in FIG. 11, that is agate electrode of the pixel transistor Tr formed in a pixel boundary region.

Figure 14:
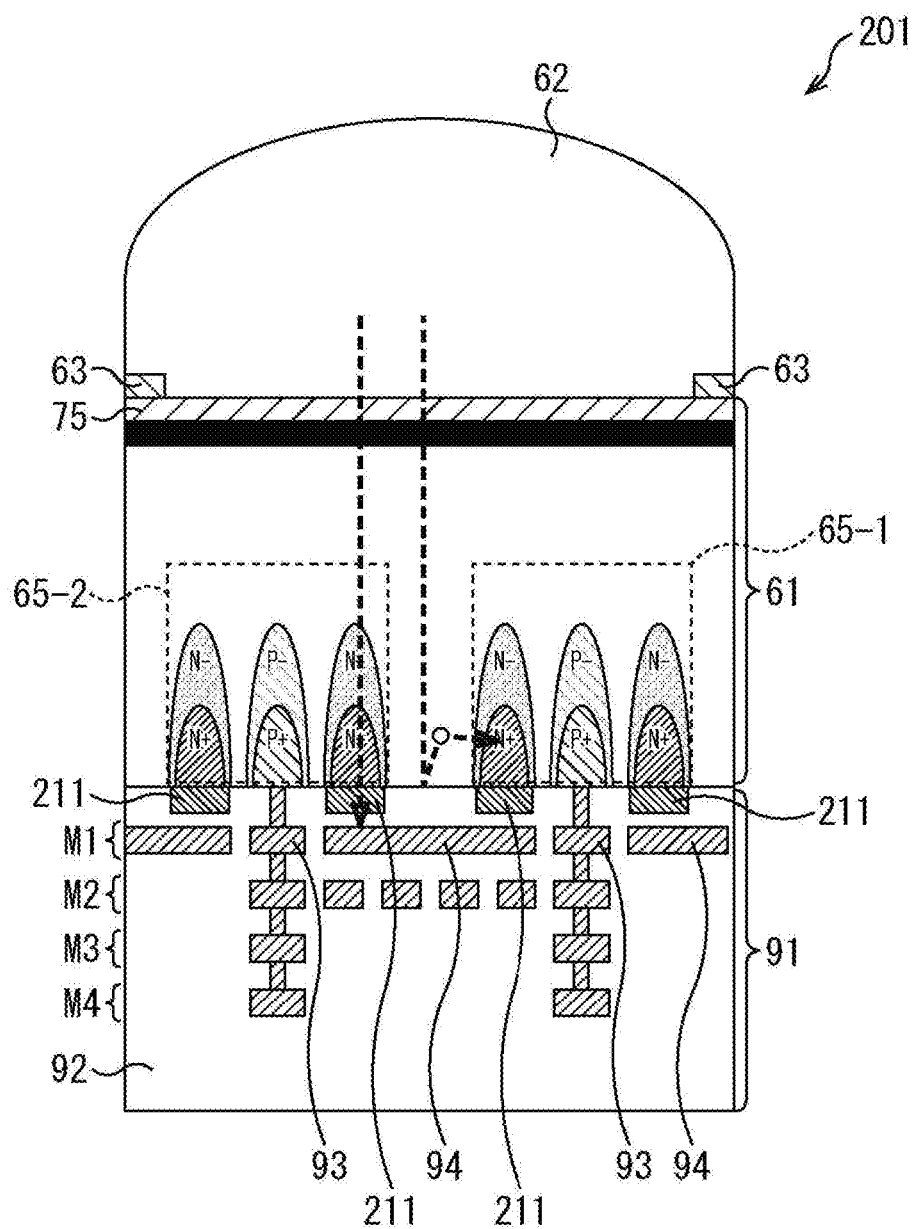
FIG. 14 is a diagram for explaining an effect of the pixel structure of the first embodiment.

Since the light is attenuated as the light penetrate deeply, the light reflected from the surface side also has higher intensity. As shown in FIG. 14, since the reflection suppressing film 211 is able to suppress reflection of light that has passed through the semiconductor substrate 61 toward the side of the semiconductor substrate 61 by forming the reflection suppressing film 211 including polysilicon between the surface side interface of the semiconductor substrate 61 and the wiring layer of the metal film M1 as described above, the incident light is reflected by the reflection member 94 and thus it is possible to reduce the charges (electrons) directly incident on the charge detection unit. As a result, in the vicinity of the charge detection unit, it is possible to suppress the charge detected by the charge detection unit without following the voltage switching, and it is possible to improve the distance measurement accuracy.

4. Second Embodiment of Pixel

Figure 15:
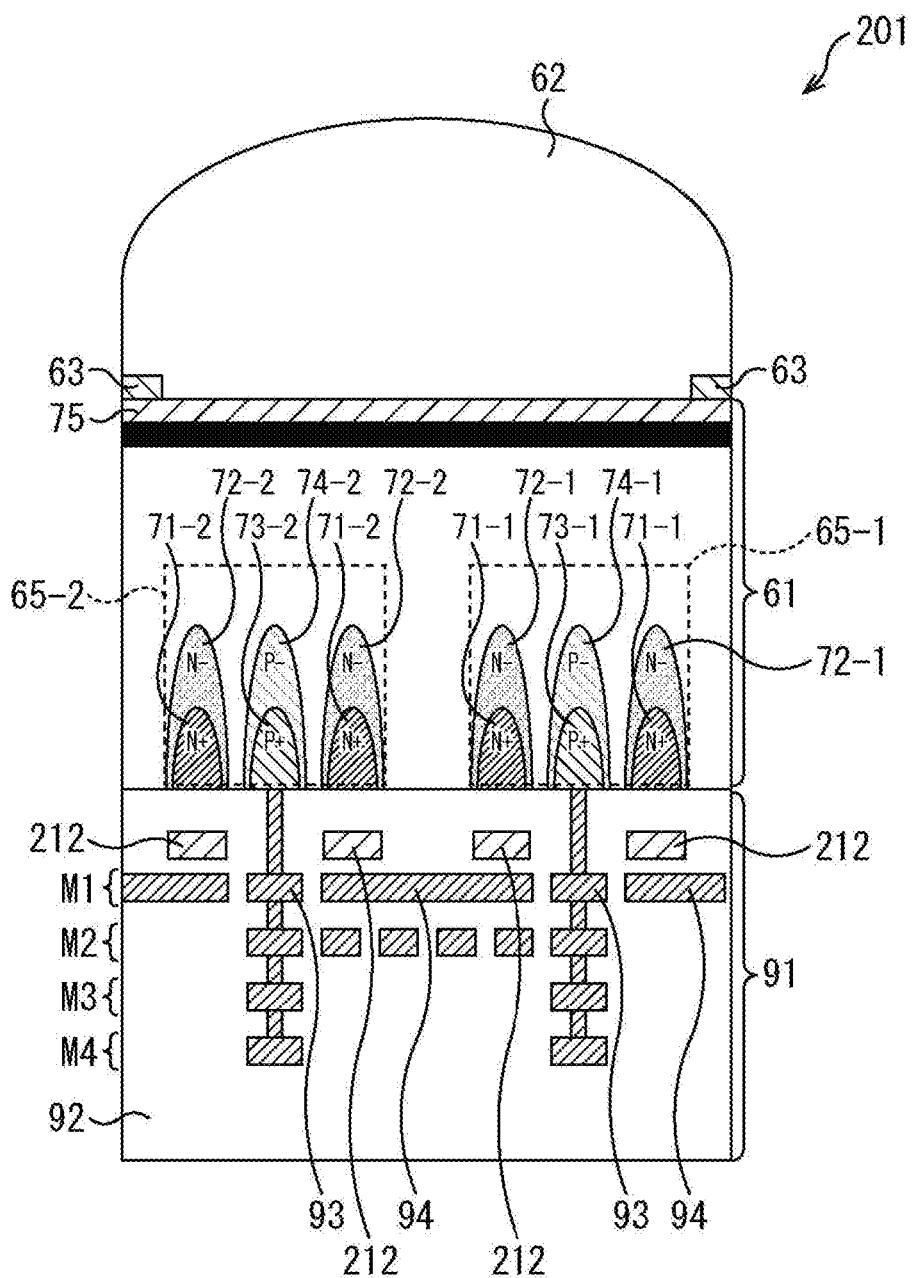
FIG. 15 is a cross-sectional view illustrating a pixel structure of a second embodiment or a pixel to which the present technology is applied.

FIG. 15 is a cross-sectional view illustrating a pixel structure of a second embodiment of a pixel to which the present technology is applied.

In comparison with the pixel 51 of FIG. 2, the pixel 201 according to the second embodiment of FIG. 15 has a difference that a reflection suppressing film 212 using a material other than polysilicon is newly formed between a surface side interface of the semiconductor substrate 61 on which the multilayer wiring layer 91 is formed and the wiring layer of the metal film M1. It is sufficient if the material of the reflection suppressing film 212 is a film of which reflectivity of light is lower than that of SiO2 that is the interlayer insulating film 92, and for example, is a nitride film such as SiN or SiCN. Similarly to the reflection suppressing film 211 of the first embodiment, the reflection suppressing film 212 is formed on a lower side of the N+ semiconductor region 71 that is the charge detection unit in FIG. 15, in other words, between the N+ semiconductor region 71 that is the charge detection unit and the wiring layer of the metal film M1, and for example, a planar surface region where the reflection suppressing film 212 is formed has an octagonal shape similarly to the N+ semiconductor region 71 that is the charge detection unit.

Similarly to the first embodiment, since the reflection suppressing film 211 is able to suppress reflection of light that has passed through the semiconductor substrate 61 toward the side of the semiconductor substrate 61 by forming the reflection suppressing film 212 using the material other than polysilicon between the surface side interface of the semiconductor substrate 61 and the wiring layer of the metal film M1 as described above, the incident light is reflected by the reflection member 94 and thus it is possible to reduce the charges (electrons) directly incident on the charge detection unit. As a result, in the vicinity of the charge detection unit, it is possible to suppress the charge detected by the charge detection unit without following the voltage switching, and it is possible to improve the distance measurement accuracy.

5. Third Embodiment of Pixel

Figure 16:
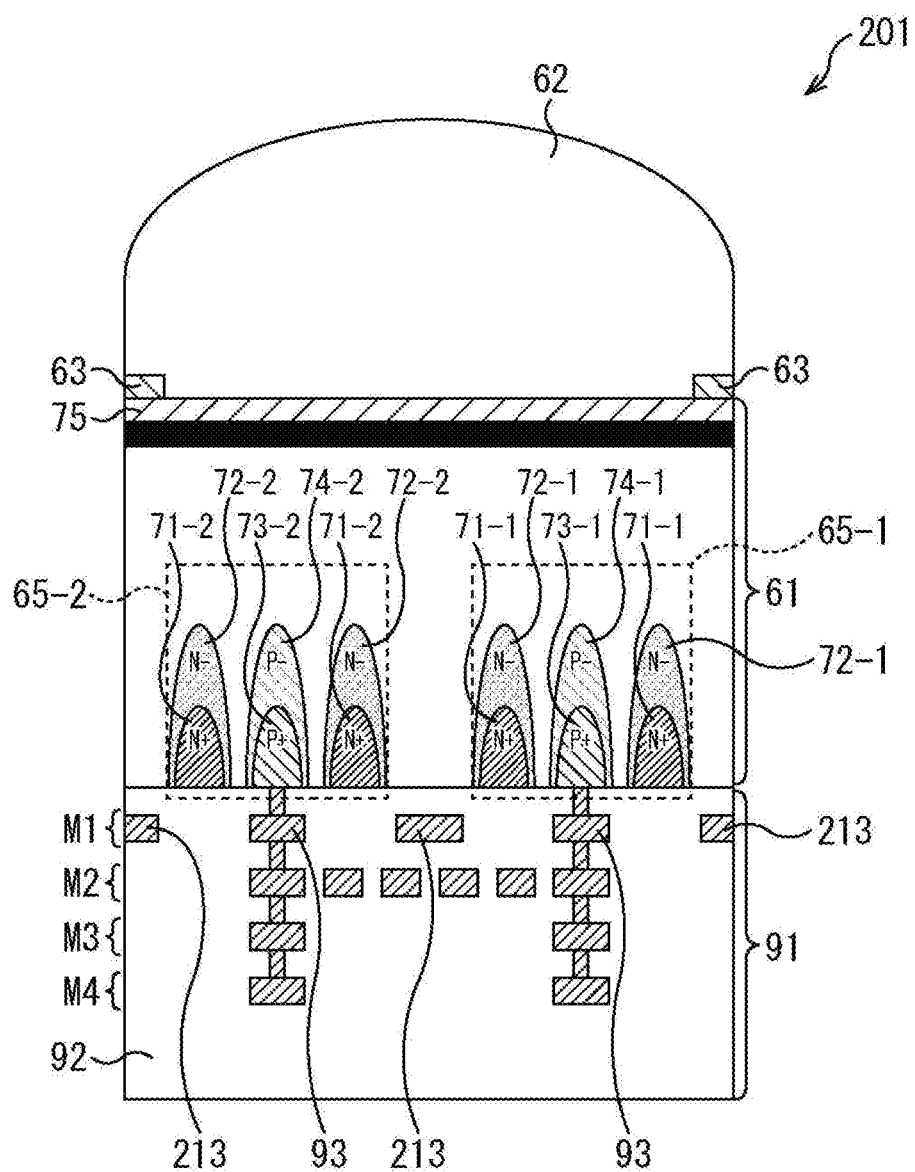
FIG. 16 is a cross-sectional view illustrating a pixel structure of a third embodiment of a pixel to which the present technology is applied.

FIG. 16 is a cross-sectional view illustrating a pixel structure of a third embodiment of a pixel to which the present technology is applied.

In comparison with the pixel 51 of FIG. 2, the pixel 201 according to the third embodiment of FIG. 16 has a difference that the reflection member 94 of the wiring layer of the metal film M1 of the multilayer wiring layer 91 is replaced with a reflection member 213.

The reflection member 94 of the pixel 51 of FIG. 2 is also formed in the region of the lower side of the N+ semiconductor region 71 that is the charge detection unit. However, the reflection member 213 of FIG. 16 is different from the reflection member 94 in that the reflection member 213 is not formed in the region of the lower side of the N+ semiconductor region 71.

Since it is possible to suppress reflection of light that has passed through the semiconductor substrate 61 toward the side of the semiconductor substrate 61 by not disposing the reflection member 213 formed on the metal film M1 of the multilayer wiring layer 91 in the region of the lower side of the N+ semiconductor region 71 as described above, the incident light is reflected by the reflection member 213 and thus it is possible to reduce the charges (electrons) directly incident on the charge detection unit. As a result, in the vicinity of the charge detection unit, it is possible to suppress the charge detected by the charge detection unit without following the voltage switching, and it is possible to improve the distance measurement accuracy.

<6. Fourth Embodiment of Pixel>

Figure 17:
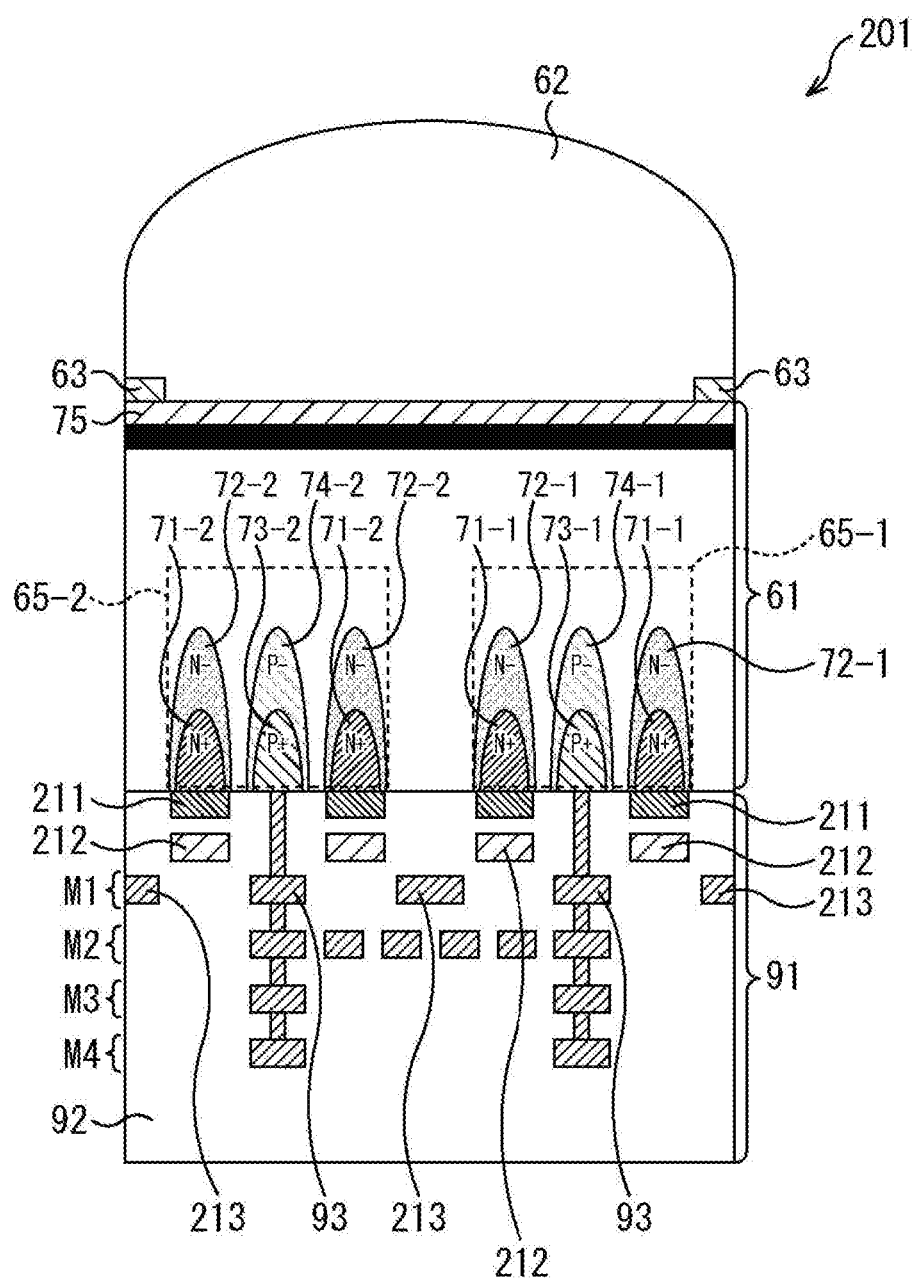
FIG. 17 is a cross-sectional view illustrating a pixel structure of a fourth embodiment of a pixel to which the present technology is applied.

FIG. 17 is a cross-sectional view illustrating a pixel structure of a fourth embodiment of a pixel to which the present technology is applied.

The pixel 201 according to the fourth embodiment of FIG. 17 has a structure including all of the configurations according to the first to third embodiments shown in FIGS. 13 to 16. That is, the pixel 201 includes the reflection suppressing film 211 shown in FIG. 13, the reflection suppressing film 212 shown in FIG. 15, and the reflection member 213 shown in FIG. 16, and other structures are similar to those of the pixel 51 of FIG. 2.

Since it is possible to suppress reflection of light that has passed through the semiconductor substrate 61 toward the side of the semiconductor substrate 61 by including the reflection suppressing film 211, the reflection suppressing film 212, and the reflection member 213 according to the first to third embodiments as described above, it is possible to further reduce the charges directly incident on the charge detection unit, winch correspond to the light that has passed through the semiconductor substrate 61. As a result, in the vicinity of the charge detection unit, it is possible to suppress the charge detected by the charge detection unit without following the voltage switching, and it is possible to improve the distance measurement accuracy.

(Modified Example of Fourth Embodiment)

Note that, in a pixel structure of FIG. 17, positions of a longitudinal direction (substrate depth direction) of the reflection suppressing film 212 and the reflection member 213 of the metal film M1 are different positions.

Figure 18:
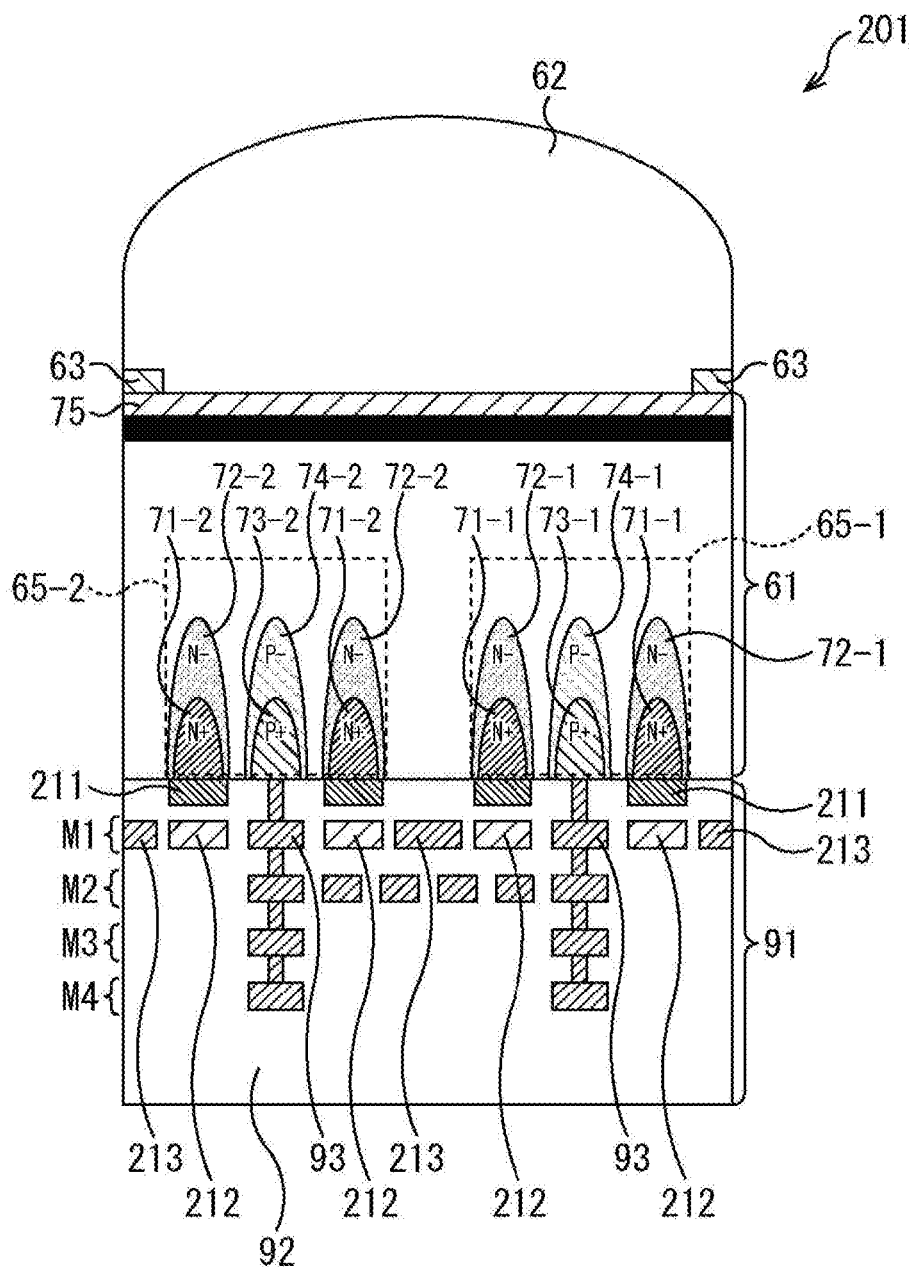
FIG. 18 is a cross-sectional view illustrating a modified example of the fourth embodiment.

However, as shown in FIG. 18, the positions of the longitudinal direction of the reflection suppressing film 212 and the reflection member 213 of the metal film M1 may be the same position.

Alternatively, as in the pixel structure of FIG. 17, the reflection suppressing film 211, the reflection suppressing film 212, and the reflection member 213 may be disposed at different layer positions, and furthermore, a reflection member that reflects light may be separately provided above the reflection member 213 of the same layer as the reflection suppressing film 212.

7. Fifth Embodiment of Pixel

Figure 19:
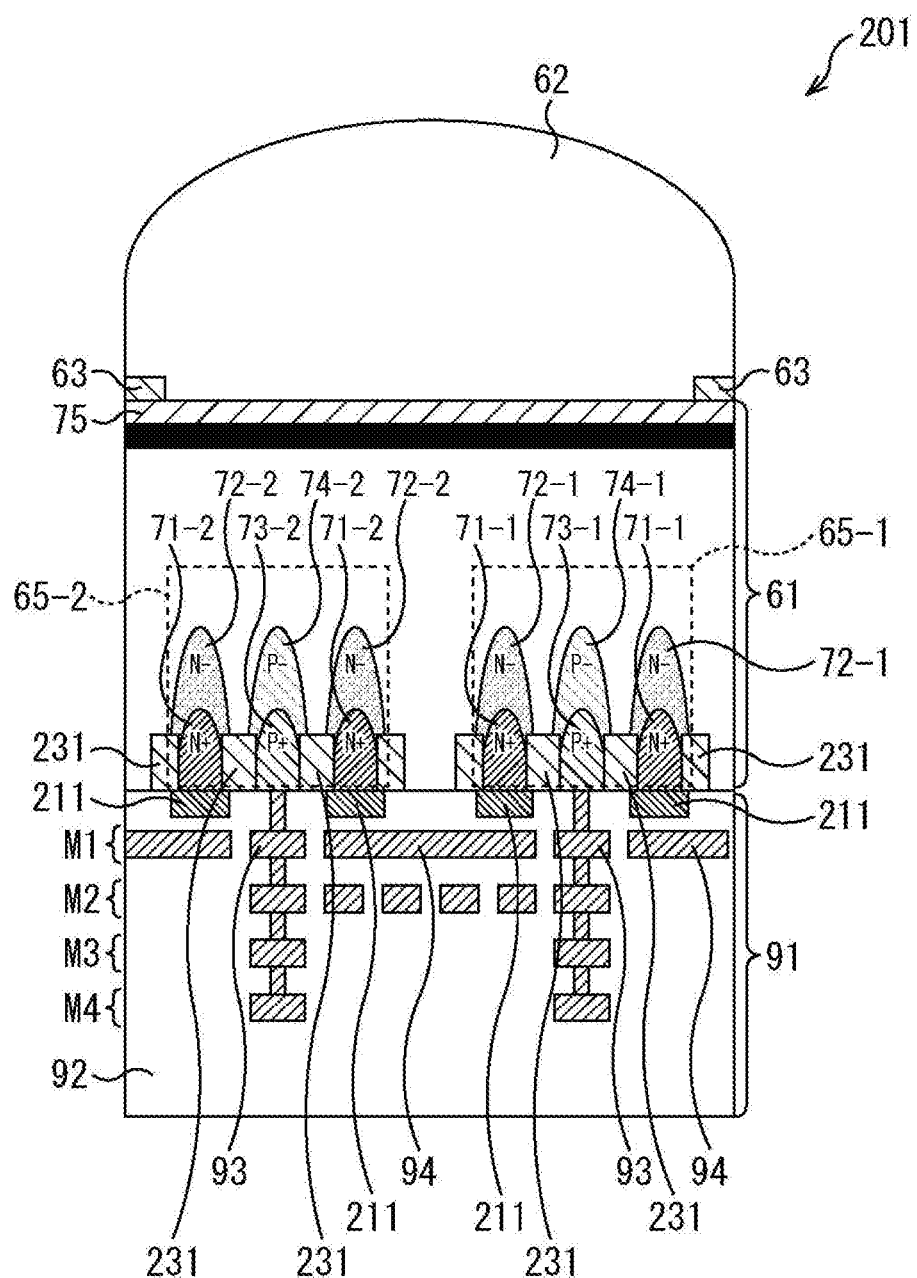
FIG. 19 is a cross-sectional view illustrating a pixel structure of a filth embodiment of a pixel to which the present technology is applied.

FIG. 19 is a cross-sectional view illustrating a pixel structure of a fifth embodiment of a pixel to which the present technology is applied.

The pixel 201 according to the fifth embodiment of FIG. 19 has a structure in which a buried insulating film (STI) 231 is further added to the structure according to the first embodiment shown in FIG. 13.

That is, in the pixel 201 of FIG. 19, the buried insulating film 231 is formed between the N+ semiconductor region 71 and the P+ semiconductor region 73, and in the vicinity of the N+ semiconductor region 71. The buried insulating film 231 separates the N+ semiconductor region 71 and the P+ semiconductor region 73 from each other. In addition, the buried insulating film 231 separates the semiconductor substrate 61 including a P-type semiconductor layer and tire N+ semiconductor region 71 from each other.

Figure 20:
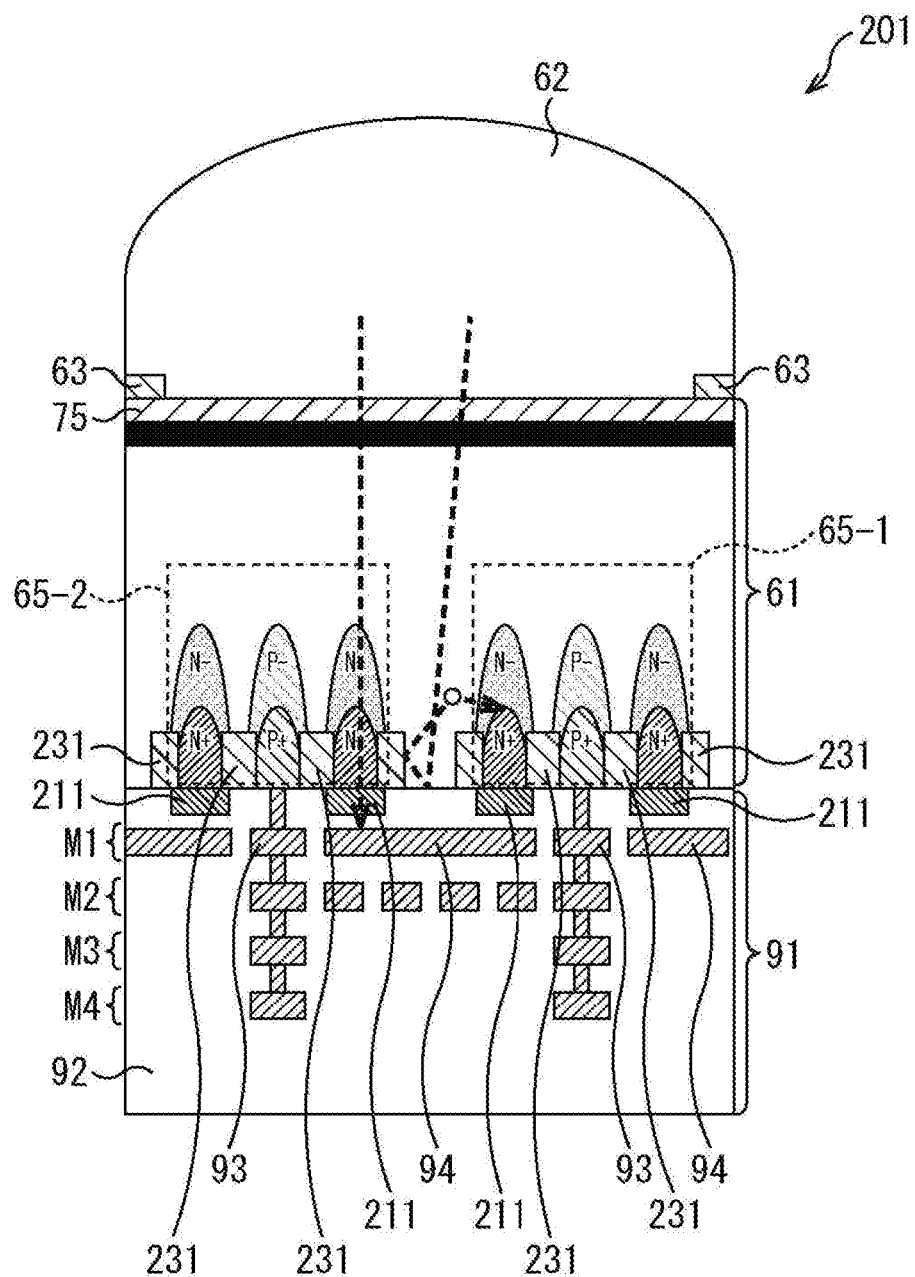
FIG. 20 is a diagram for explaining an effect of the pixel structure of the fifth embodiment.

It is possible to securely separate the N+ semiconductor region 71 and the P+ semiconductor region 73 from each other by forming the buried insulating film 231 in the vicinity of the N+ semiconductor region 71 and the P+ semiconductor region 73 as described above. In addition, as shown in FIG. 20, it is possible to further reduce charges, which are generated by photoelectric conversion of oblique light or reflected light of the oblique light, incident on the charge detection unit. As a result, in the vicinity of the charge detection unit, it is possible to suppress the charge detected by the charge detection unit without following the voltage switching, and it is possible to improve live distance measurement accuracy.

Note that, the pixel 201 according to the fifth embodiment of FIG. 19 has a structure in which the buried insulating film 231 is further added to the structure according to the first embodiment shown in FIG. 13, however, of course, a structure in which the buried insulating film 231 is further added to the second to fourth embodiments and the modified example of the fourth embodiment described above is also possible. Also in this case, in the vicinity of the charge detection unit, it is possible to suppress the charge detected by the charge detection unit without following the voltage switching, and it is possible to improve die distance measurement accuracy.

8. Sixth Embodiment of Pixel

Figure 21:
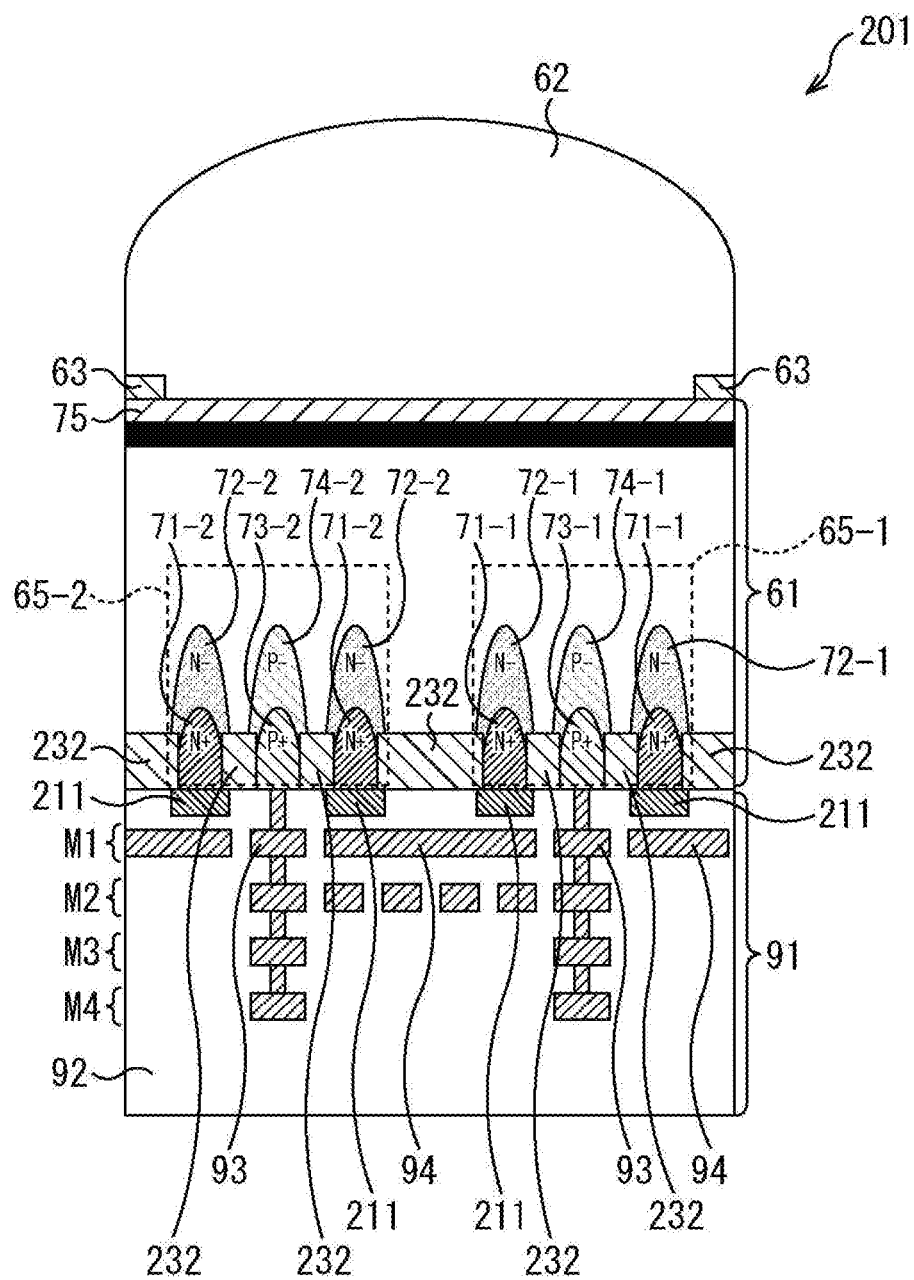
FIG. 21 is a cross-sectional view illustrating a pixel structure of a sixth embodiment of a pixel to which the present technology is applied.

FIG. 21 is a cross-sectional view illustrating a pixel structure of a sixth embodiment of a pixel to which the present technology is applied.

The pixel 201 according to the sixth embodiment of FIG. 21 has a structure in which a buried insulating film (STI) 232 is further added to the structure according to the first embodiment shown in FIG. 13.

Here, in comparison with the pixel 201 according to the fifth embodiment shown in FIG. 19, in the pixel 201 of FIG. 19, the buried insulating film 231 is formed between the N+ semiconductor region 71 and the P+ semiconductor region 73 and the vicinity of the N+ semiconductor region 71, and the buried insulating film 231 is not formed in the vicinity of an interface between a pixel central portion and the semiconductor substrate 61 of the pixel boundary portion.

On the other hand, in the pixel 201 according to the sixth embodiment shown in 21, the buried insulating film 232 is also formed in the vicinity of the interface between the pixel central portion and the semiconductor substrate 61 of the pixel boundary portion. More specifically, the buried insulating film 232 is also formed between the N+ semiconductor regions 71-1 and 71-2 of the pixel central portion, between the N+ semiconductor region 71-1 in the vicinity of a pixel boundary and the N+ semiconductor region 71-2 (not shown) of a right adjacent pixel 201, and between the N+ semiconductor region 71-2 in the vicinity of the pixel boundary and the N+ semiconductor region 71-1 (not shown) of a left adjacent pixel 201. Similarly to the pixel 201 according to the fifth embodiment shown in FIG. 19, the buried insulating film 232 is also formed between the N+ semiconductor region 71 and the P+ semiconductor region 73 and in the vicinity of the N+ semiconductor region 71.

Figure 22:
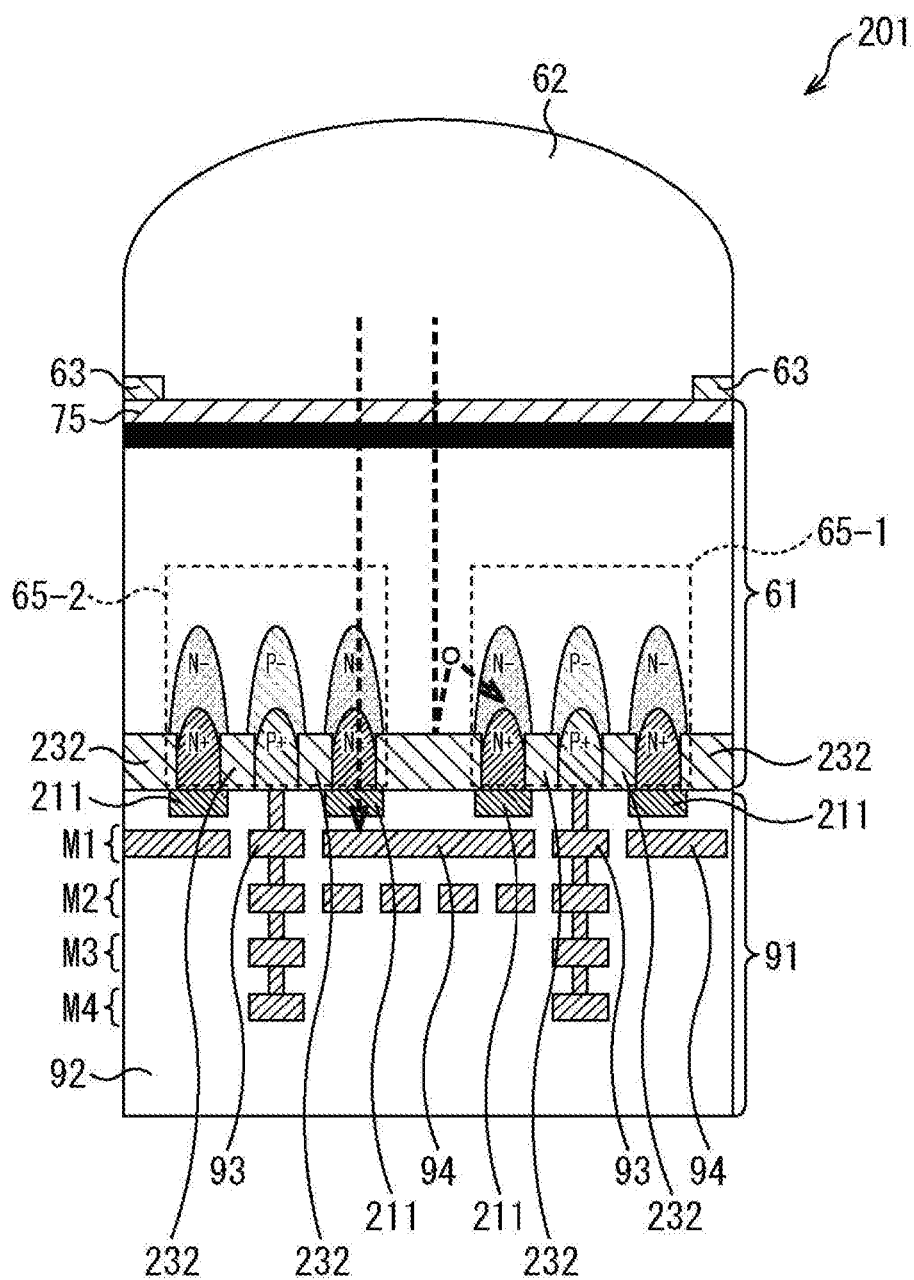
FIG. 22 is a diagram for explaining an effect of the pixel structure of the sixth embodiment.

As shown in FIG. 22, it is possible to improve the reflectivity of the incident light of the pixel central portion and the pixel boundary portion other than the charge detection unit, by forming the buried insulating film 232 also in the vicinity of the interface of the semiconductor substrate 61 of the pixel central portion and the pixel boundary portion in addition to the vicinity of the semiconductor region 71 and the P+ semiconductor region 73 as described above. As a result, in the vicinity of the charge detection unit, it is possible to suppress the charge detected by the charge detection unit without following the voltage switching, and it is possible to improve the distance measurement accuracy by increasing the charges detected by the active tap.

Note that, the pixel 201 according to the sixth embodiment of FIG. 21 has a structure in which the buried insulating film 232 is further added to the structure according to the first embodiment shown in FIG. 13, however, of course, a structure in which the buried insulating film 232 is further added to the second to fourth embodiments and the modified example of the fourth embodiment described above is also possible. Also in this case, in the vicinity of the charge detection unit, it is possible to suppress the charge detected by the charge detection unit without following the voltage switching, and it is possible to improve the distance measurement accuracy by increasing the charges detected by the active tap.

9. Seventh Embodiment of Pixel

Figure 23:
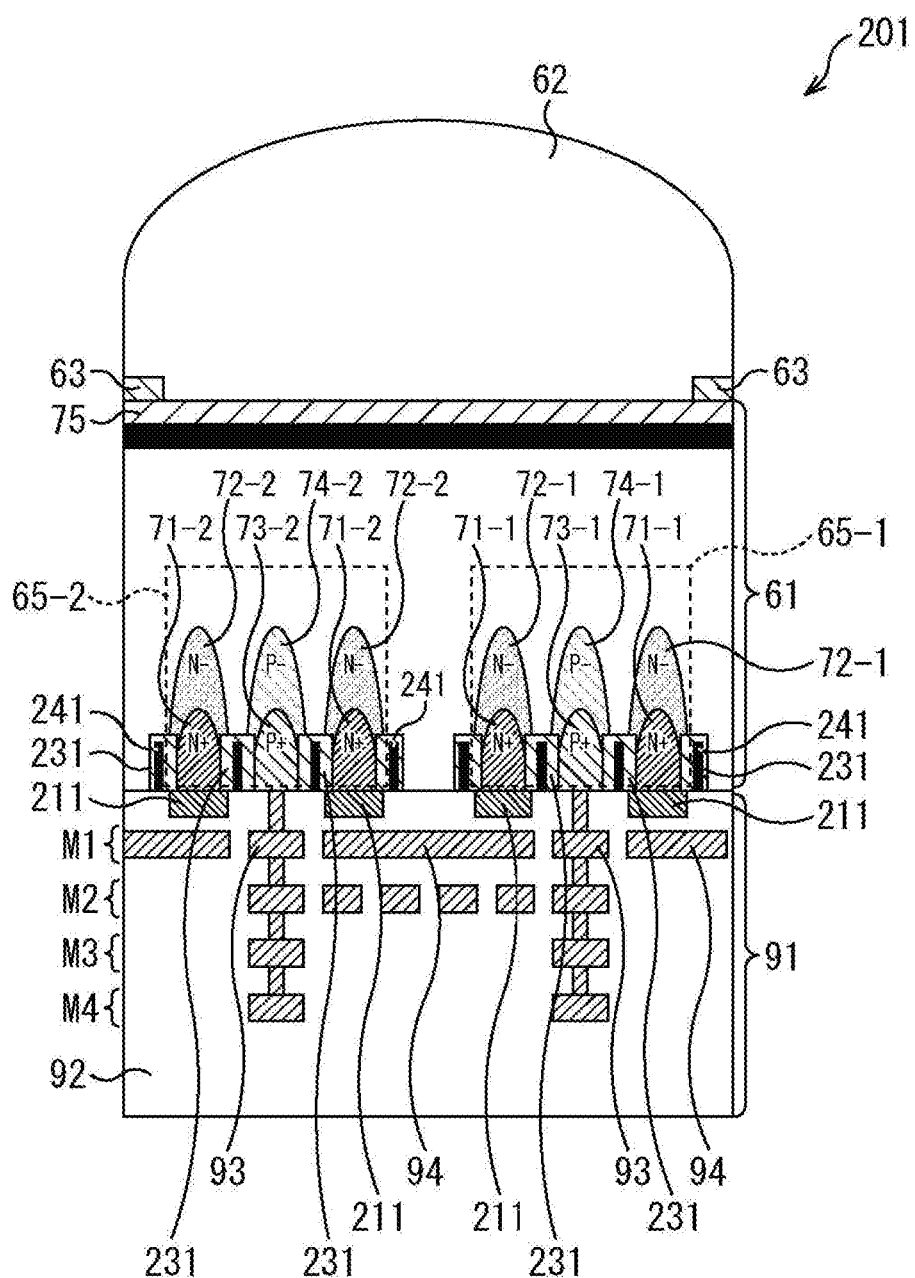
FIG. 23 is a cross-sectional view illustrating a pixel structure of a seventh embodiment of a pixel to which the present technology is applied.

FIG. 23 is a cross-sectional view illustrating a pixel structure of a seventh embodiment of a pixel to which the present technology is applied.

The pixel 201 according to the seventh embodiment in FIG. 23 has a structure in which a light shielding film 241 is further added to the buried insulating film 232 of the configuration according to the fifth embodiment shown in FIG. 19. Since the shielding film 241 is formed in the buried insulating film 232, the light shielding film 241 is formed between, the semiconductor region 71 and the P+ semiconductor region 73 and in the vicinity the semiconductor region 71. For a material of the light shielding film 241, for example, a metal material such as tungsten (W) is used, but it is not limited thereto as long as the material is a light shielding material.

Figure 24:
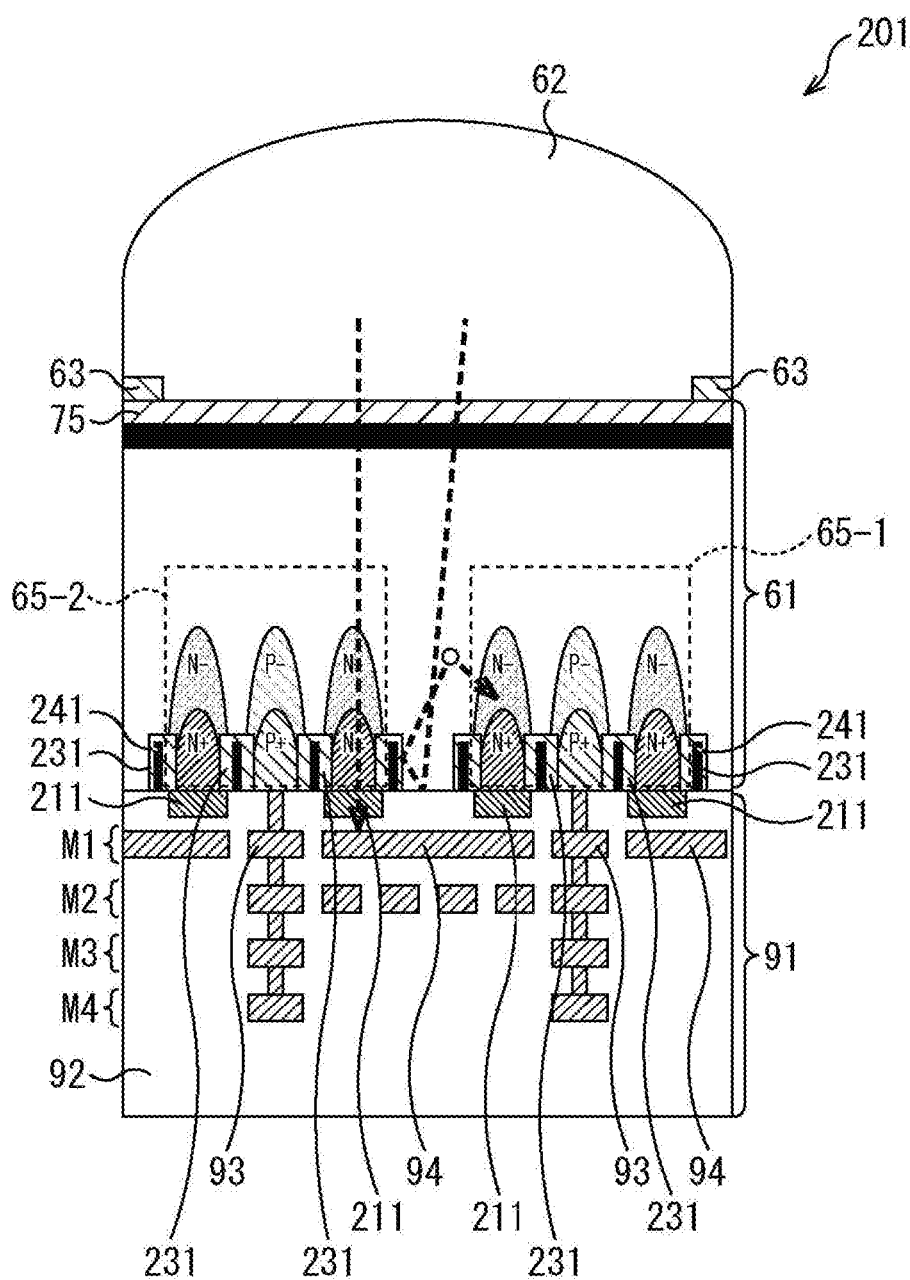
FIG. 24 is a diagram for explaining an effect of the pixel structure of the seventh embodiment.

As shown in FIG. 24, it is possible to further reduce charges, which are generated by the photoelectric conversion of the oblique light or the reflected light of the oblique light, incident on the charge detection unit, by further providing the light shielding film 241 in the buried insulating film 231 as described above. As a result, in the vicinity of the charge detection unit, it is possible to suppress the charge detected by the charge detection unit without following the voltage switching, and it is possible to improve the distance measurement accuracy.

Note that, the pixel 201 according to the seventh embodiment of FIG. 23 has a structure in which the buried insulating film 231 and the light shielding film 241 are further added to the configuration according to the first embodiment shown in FIG. 13, however, of course, a structure in which the buried insulating film 231 and the light shielding film 241 of FIG. 23 are further added to the second to fourth embodiments and the modified example of the fourth embodiment described above is also possible. Also in this case, in the vicinity of the charge detection unit, it is possible to suppress the charge detected by the charge detection unit without following the voltage switching, and it is possible to improve the distance measurement accuracy.

<10. Eighth Embodiment of Pixel>

Figure 25:
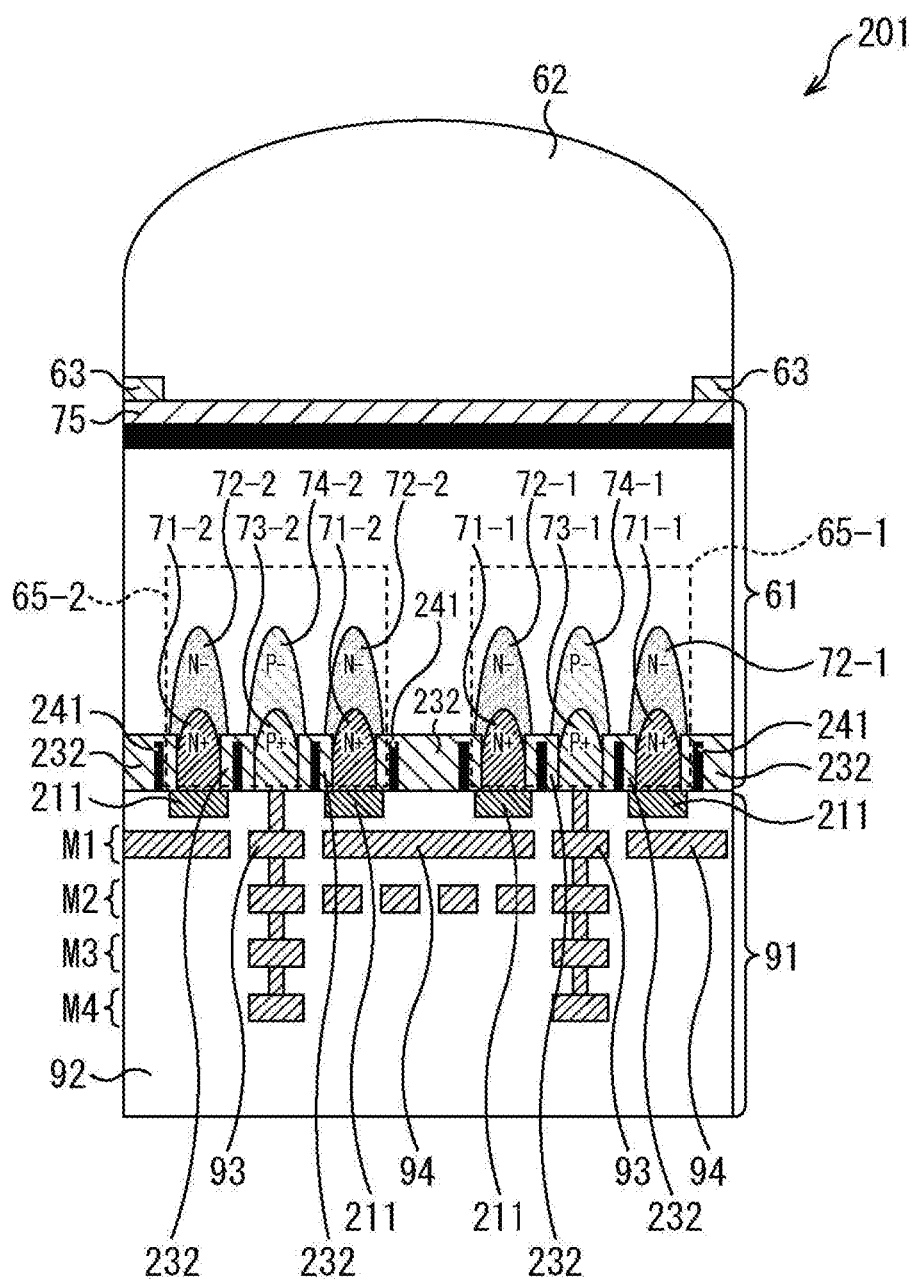
FIG. 25 is a cross-sectional view illustrating a pixel structure of an eighth embodiment of a pixel to which the present technology is applied.

FIG. 25 is a cross-sectional view illustrating a pixel structure of an eighth embodiment of a pixel to which the present technology is applied.

The pixel 201 according to the eighth embodiment shown in FIG. 25 has a structure in which the light shielding film 241 of the seventh embodiment shown in FIG. 23 is further added to the buried insulating film 232 of the configuration according to the sixth embodiment shown in FIG. 21.

Similarly to the sixth embodiment, it is possible to improve the reflectivity of the incident light of the pixel central portion and the pixel boundary portion other than the charge detection unit, by forming the buried insulating film 232 also in the vicinity of the interface of the semiconductor substrate 61 of the pixel central portion and the pixel boundary portion in addition to the vicinity of the N+ semiconductor region 71 and the P+ semiconductor region 73 as described above. As a result, in the vicinity of the charge detection unit, it is possible to suppress the charge detected by the charge detection unit without following the voltage switching, and it is possible to improve the distance measurement accuracy by increasing the charges detected by the active tap.

In addition, similarly to the seventh embodiment, it is possible to further reduce charges, which are generated by the photoelectric conversion of the oblique light or the reflected light of the oblique light, incident on the charge detection unit by further providing the light shielding film 241 in the buried insulating film 232. As a result, in the vicinity of the charge detection unit, it is possible to suppress the charge detected by the charge detection unit without following the voltage switching, and it is possible to improve the distance measurement accuracy.

Note that, the pixel 201 according to the eighth embodiment of FIG. 25 has a structure in which the buried insulating film 232 and the light shielding film 241 are further added to the configuration according to the first embodiment shown in FIG. 13, however, of course, a structure in which the buried insulating film 232 and the light shielding film 24-1 of FIG. 25 are further added to the second to fourth embodiments and the modified example of the fourth embodiment described above is also possible. Also in this case, in the vicinity of the charge detection unit, it is possible to suppress the charge detected by the charge detection unit without following the voltage switching, and it is possible to improve the distance measurement accuracy.

11. Ninth Embodiment of Pixel

Figure 26:
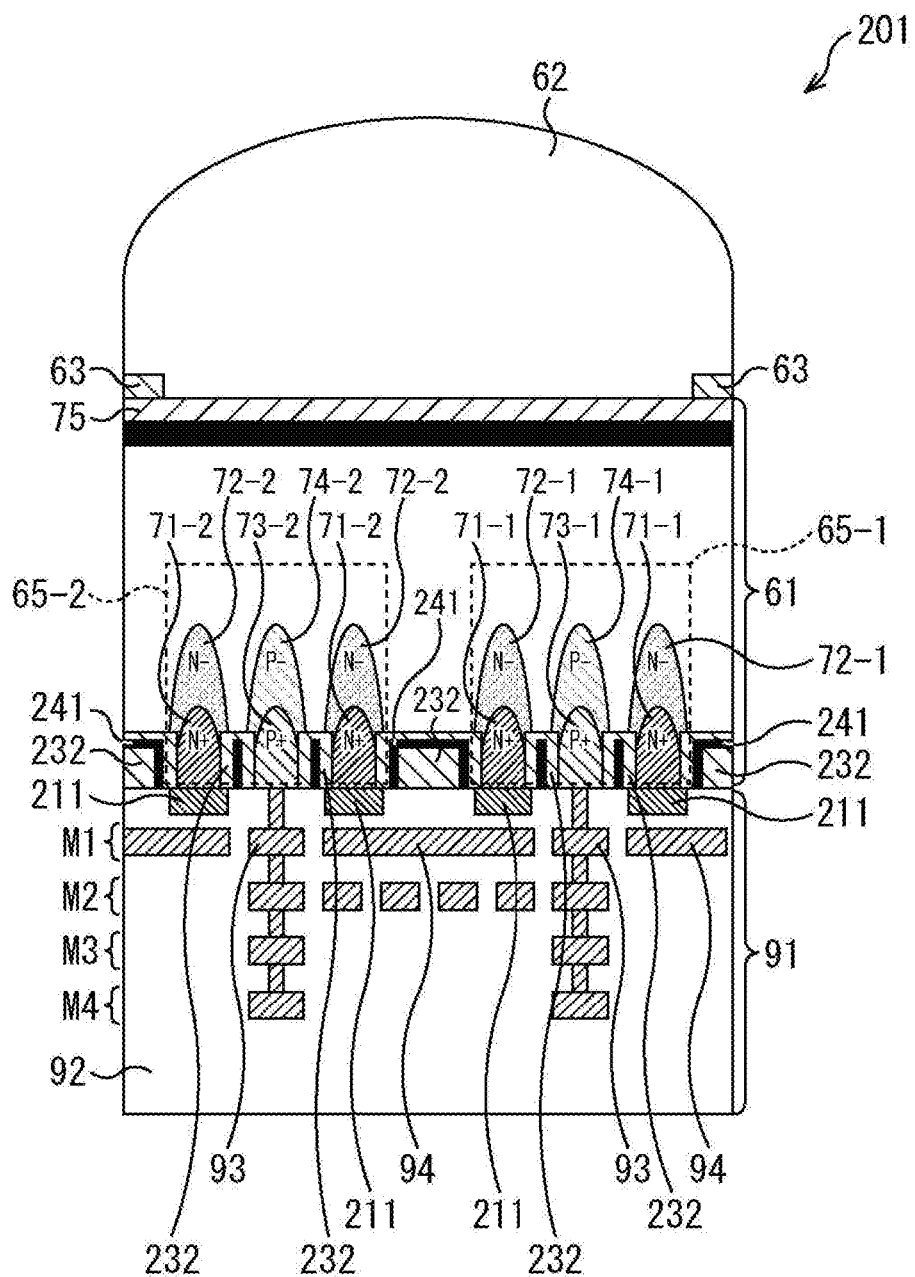
FIG. 26 is a cross-sectional view illustrating a pixel structure of a ninth embodiment of a pixel to which the present technology is applied.

FIG. 26 is a cross-sectional view illustrating a pixel structure of a ninth embodiment of a pixel to which the present technology is applied.

The pixel 201 according to the ninth embodiment of FIG. 26 is different from the configuration according to the eighth embodiment shown in FIG. 25 only in the structure of the light shielding film 241.

Specifically, in the pixel 201 according to the eighth embodiment of FIG. 25, the light shielding film 241 is formed only in the vicinity (side portion) of the N+ semiconductor region 71 and the P+ semiconductor region 73 in the buried insulating film 232.

On the other hand, in the pixel 201 according to the ninth embodiment of FIG. 26, the light shielding film 241 is also formed in the vicinity of an upper surface in the buried insulating film 232 of the pixel central portion and the pixel boundary portion, in addition to the vicinity (side portion) of the N+ semiconductor region 71 and the P+ semiconductor region 73 in the buried insulating film 232. More specifically, the light shielding film 241 is also formed in the vicinity of the upper surfaces of the inside of the buried insulating film 232 between the N+ semiconductor regions 71-1 and 71-2 of the pixel central portion, the inside the buried insulating film 232 between the N+ semiconductor region 71-1 in the vicinity of the pixel boundary and the N+ semiconductor region 71-2 (not shown) of the right adjacent pixel 201, and inside of the buried insulating film 232 between the N+ semiconductor region 71-2 in the vicinity of the pixel boundary and the N+ semiconductor region 71-1 (not shown) of the left adjacent pixel 201.

As described above, with respect to a wide portion of a formation region of the buried insulating film 232, the light shielding film 241 may also be formed in a region of a plane direction as well as the vicinity (side portion) of the N+ semiconductor region 71 or the P+ semiconductor region 73.

Figure 27:
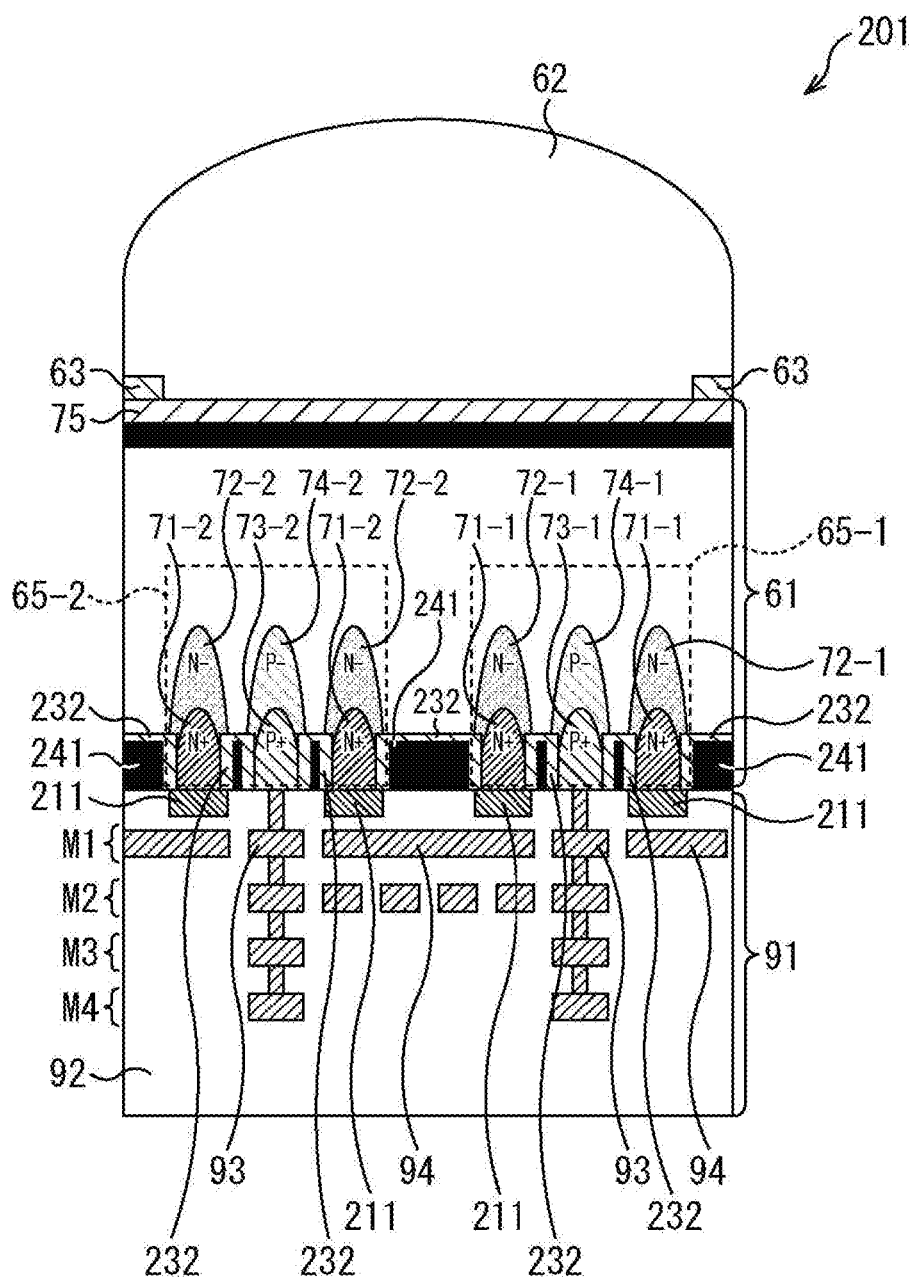
FIG. 27 is a cross-sectional view illustrating a modified example of the ninth embodiment.

In addition, as shown in FIG. 26, the light shielding film 241 may be formed so that the region between the two N+ semiconductor regions 71 adjacent to the pixel central portion and the pixel boundary portion is buried from tire substrate interface to a predetermined depth in the buried insulating film 232 as shown in FIG. 27, as well as the vicinity (side portion) of the N+ semiconductor region 71 or the P+ semiconductor region 73 and the vicinity of the upper surface of the buried insulating film 232.

12. Summary

The pixel 201 according to the first to ninth embodiments described above has a reflection suppressing structure that suppresses reflection of light in a plane region in the multilayer wiring layer 91 corresponding to the first charge detection unit (for example, N+ semiconductor region 71-1) and the second charge detection unit (for example, N+ semiconductor region 71-2).

The reflection suppressing structure is, for example, the reflection suppressing film 211 including the polysilicon in the first embodiment of FIG. 13, and the reflection suppressing film 212 including the nitride film in the second embodiment of FIG. 15. In addition, in the third embodiment of FIG. 16, the reflection suppressing structure is the reflection member 213 formed so as not to be disposed in the region of the lower side of the N+ semiconductor region 71, and in the fourth embodiment of FIG. 17, the reflection suppressing structure is the structure in which the reflection suppressing film 211 and the reflection suppressing film 212 are stacked in the stacking direction of the multilayer wiring layer 91.

The light that has passed through the semiconductor substrate 61 is reflected toward the semiconductor substrate 61 since the pixel 201 includes the reflection suppressing structure. Therefore, it is possible to reduce the charge directly incident on the charge detection unit. As a result, in the vicinity of the charge detection unit, it is possible to suppress the charge detected by the charge detection unit without following the voltage switching, and it is possible to improve the distance measurement accuracy.

13. Configuration Example of Ranging Module

Figure 28:
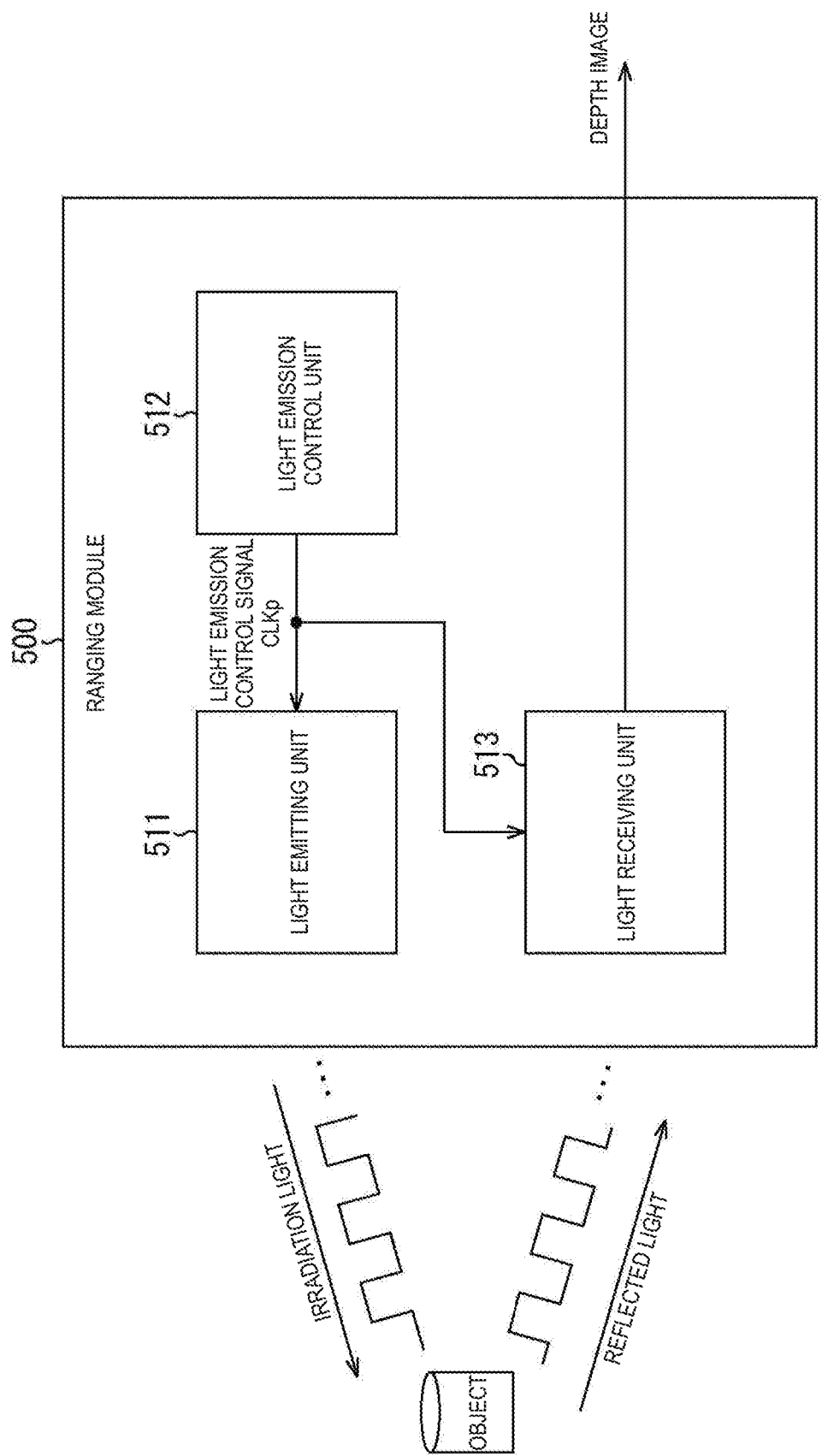
FIG. 28 is a block diagram illustrating a configuration example of a ranging module.

FIG. 28 is a block diagram illustrating the configuration example of the ranging module that outputs distance measurement information using the light receiving element 1 including any pixel structure among the first to ninth embodiments.

The ranging module 500 includes a light emitting unit 511, a light emission control unit 512, and a light receiving unit 513.

The light emitting unit 511 has a light source that emits light having a predetermined wavelength, and irradiates the object with irradiation light of which brightness periodically changes. For example, the light emitting unit 511 has a light emitting diode that emits infrared light having a wavelength in a range of 780 nm to 1000 nm as a light source, and generates the irradiation light in synchronization with a light emission control signal CLKp of a rectangular wave supplied from the light emission control unit 512.

Note that, the light emission control signal CLKp is not limited to the rectangular wave as long as the control signal CLKp is a periodic signal. For example, the light emission control signal CLKp may be a sine wave.

The light emission control unit 512 supplies the light emission control signal CLKp to the light emitting unit 511 and the light receiving unit 513 and controls an irradiation timing of the irradiation light. A frequency of the light emission control signal CLKp is, for example, 20 megahertz (MHz). Note that, the frequency of the light emission control signal CLKp is not limited to 20 megahertz (MHz), and may be 5 megahertz (MHz) or the like.

The light receiving unit 513 receives reflected light reflected from the object, calculates the distance information for each pixel according to a light reception result, generates a depth image in which the distance to the object is represented by a gradation value for each pixel, and outputs the depth image.

The light receiving element 1 including any pixel structure among the first to ninth embodiments is used for the light receiving unit 513. For example, the light receiving element 1 serving as the light receiving unit 513 calculates the distance information for each pixel from a signal intensity detected, by each charge detection unit (N+ semiconductor region 71) of each of the signal extraction units 65-1 and 65-2 of each pixel 201 of the pixel array unit 21, on the basis of the light emission control signal CLKp.

As described above, the light receiving element 1 including any pixel structure among the first to ninth embodiments is able to be incorporated as a light receiving unit 513 of a ranging module 500 that obtains the distance information to the object by the indirect ToF method and outputs the distance information. Therefore, it is possible to improve the distance measurement characteristic as the ranging module 500.

As described above, according to an embodiment of the present technology, it is possible to improve the distance measurement characteristic by configuring the CAPD sensor as the light receiving element of the rear surface irradiation type.

Note that, for example, the light receiving element 1 is able to be applied to various electronic apparatus such as an imaging device such as a digital still camera or a digital video camera having a distance measurement function, and a mobile phone having a distance measurement function, in addition to the tanning module described above.

In the present technology, of course, combination of the above-described embodiments is also possible as appropriate. That is, for example, according to which characteristic such as the sensitivity of the pixel is prioritized, it is possible to select the number or a position of the signal extraction units provided in the pixel, a shape of the signal extraction unit or whether or not to cause the signal extraction unit to have a shared structure, presence or absence of the on-chip lens, presence or absence of the inter-pixel light shielding portion, presence or absence of a separation region, a thickness of the on-chip lens or the substrate, a type or film design of the a substrate, presence or absence of bias on incident surface, presence or absence of the reflection member, and the like as appropriate.

In addition, in the above description, an example in which the election is used as the signal carrier has been described. However, a hole generated by photoelectric conversion may be used as the signal carrier. In such a case, it is sufficient that the charge detection unit for detecting the signal carrier includes the P+ semiconductor region, the voltage applying unit for generating the electric field in the substrate includes the N+ semiconductor region, and the hole as the signal carrier is detected in the charge detection unit provided in the signal extraction unit.

14. Application Example to Endoscopic Surgery System

The present disclosure technology (present technology) can be applied to various products. For example, the present disclosure technology may be applied to the endoscopic surgery system.

Figure 29:
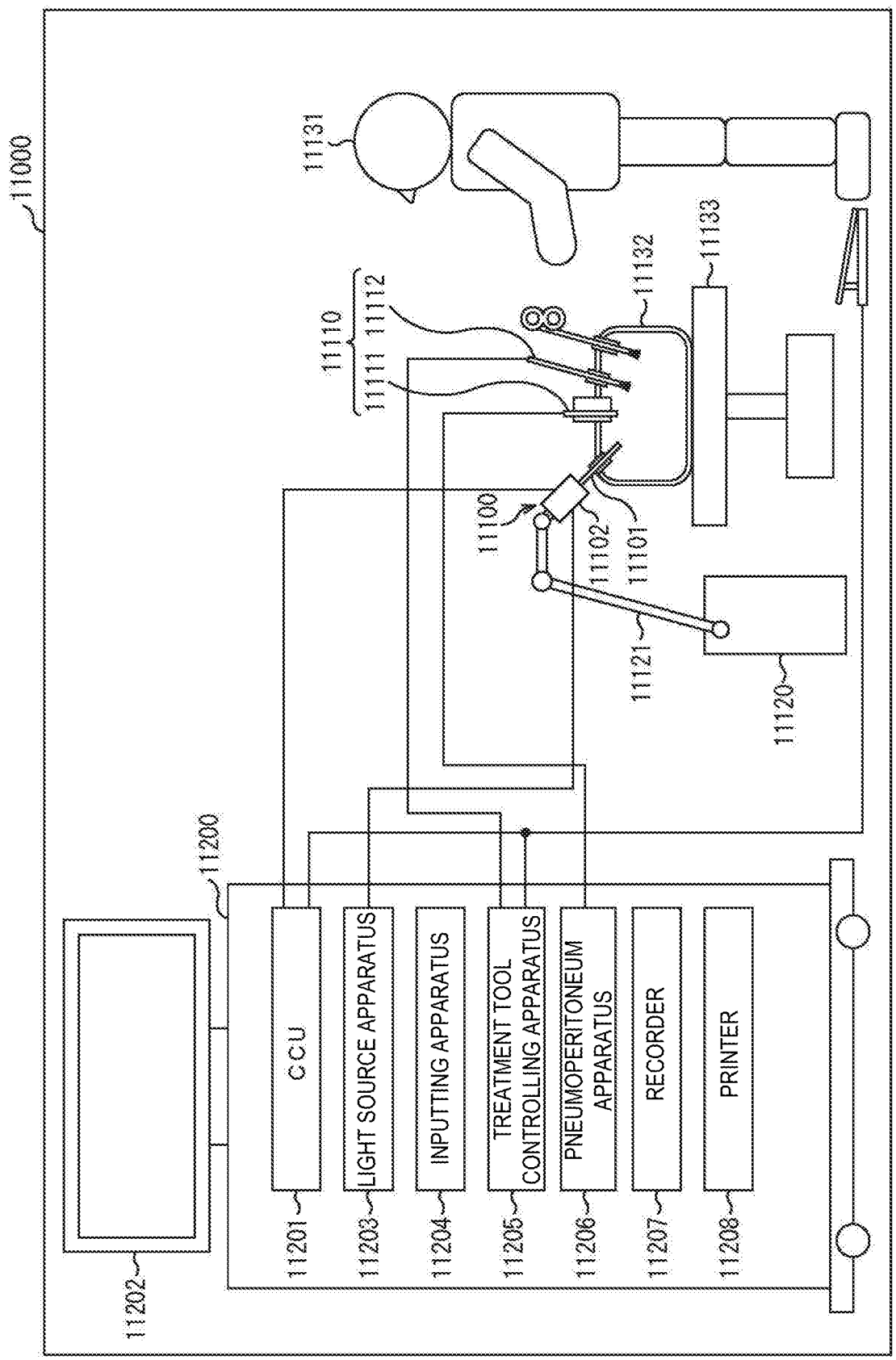
FIG. 29 is a view depicting an example of a schematic configuration of an endoscopic surgery system.

FIG. 29 is a view depicting an example of a schematic configuration of an endoscopic surgery system to which the technology according to an embodiment of the present disclosure (present technology) can be applied.

In FIG. 29, a state is illustrated in which a surgeon (medical doctor) 11131 is using au endoscopic surgery system 11000 to perform surgery for a patient 11132 on a patient bed 11133. As depicted, the endoscopic surgery system 11000 includes an endoscope 11100, other surgical tools 11110 such as pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photo-electrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 recevies an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body (issue and irradiating excitation light corresponding to a fluorescent light wavelength of the reagent upon the body tissue. The light source apparatus 11203 can be configured to supply such narrow-hand light and/or excitation light suitable for special light observation as described above.

Figure 30:
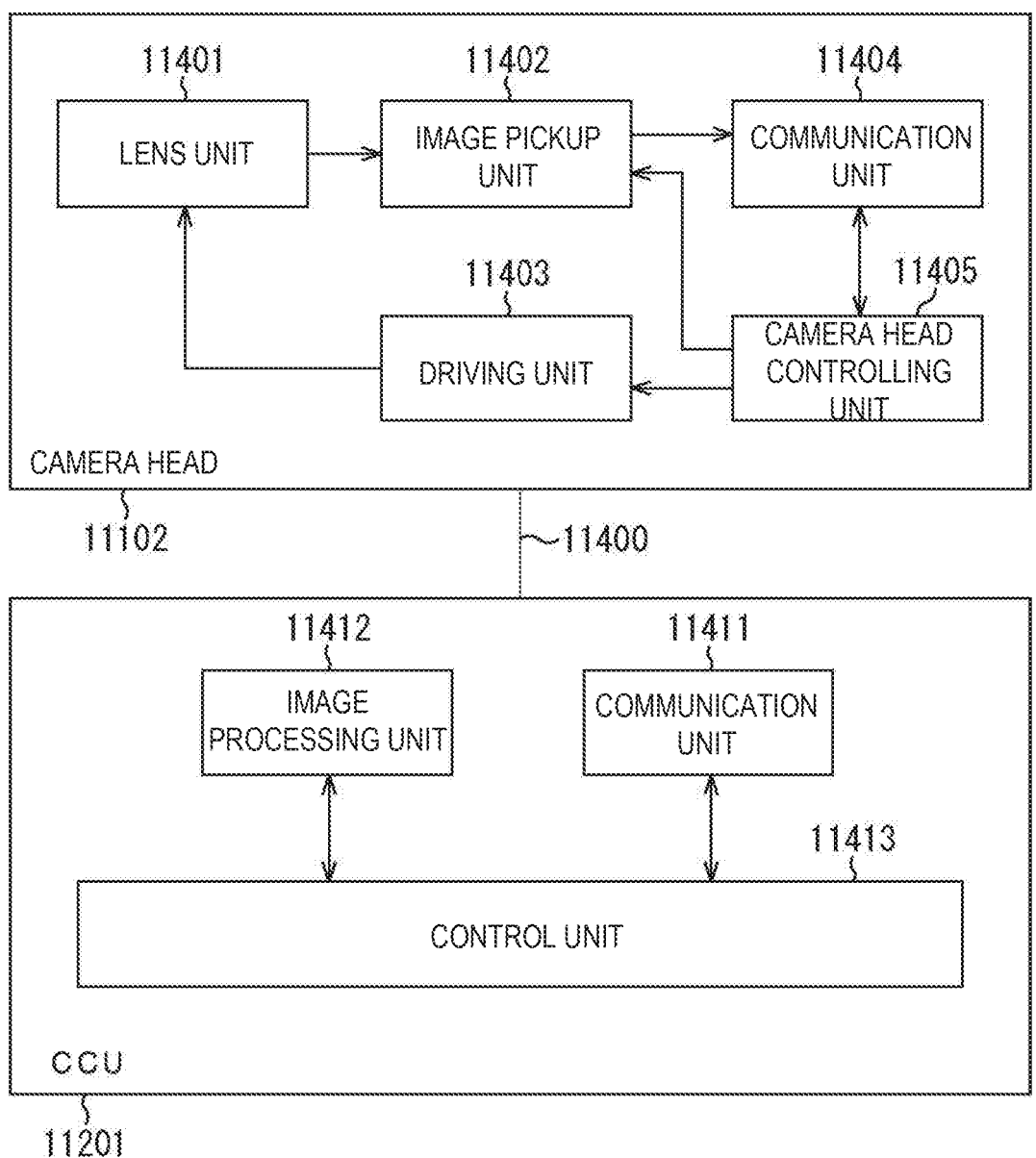
FIG. 30 is a block diagram depicting an example of a functional configuration of a camera head and a camera control unit (CCU).

FIG. 30 is a block diagram depicting an example of a functional configuration of the camera head 11102 and the CCU 11201 depicted in FIG. 29.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and tire left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 is provided corresponding 10 the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and front the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera bead 11102 and the CCU 11201 may be performed by wireless communication.

As described above, an example of an endoscopic surgery system to which the technology according to the present disclosure can be applied has been described. The technology according to the present disclosure can be applied to the imaging section 11402 among the above-described configurations. Specifically, the light receiving element 1 having the pixel 201 is able to be applied as a part of the configuration of the image pickup unit 11402. It is possible to measure the distance to the operation site with high accuracy by applying the technology according to an embodiment of the present disclosure as a part of the configuration or the image pickup unit 11402, and it is possible to obtain a clearer image of the operation site.

Note that, although the endoscopic surgery system has been described as an example herein, the technology according to the present disclosure may also be applied to others, for example, a microscope surgery system, and the like.

15. Example of Application to Mobile Object

The technology according to an embodiment of the present disclosure (present technology) is applicable to a variety of products. For example, the technology according to an embodiment of the present disclosure is implemented as devices mounted on any type of mobile objects such as automobiles, electric vehicles, hybrid electric vehicles, motorcycles, bicycles, personal mobilities, airplanes, drones, ships, and robots.

Figure 31:
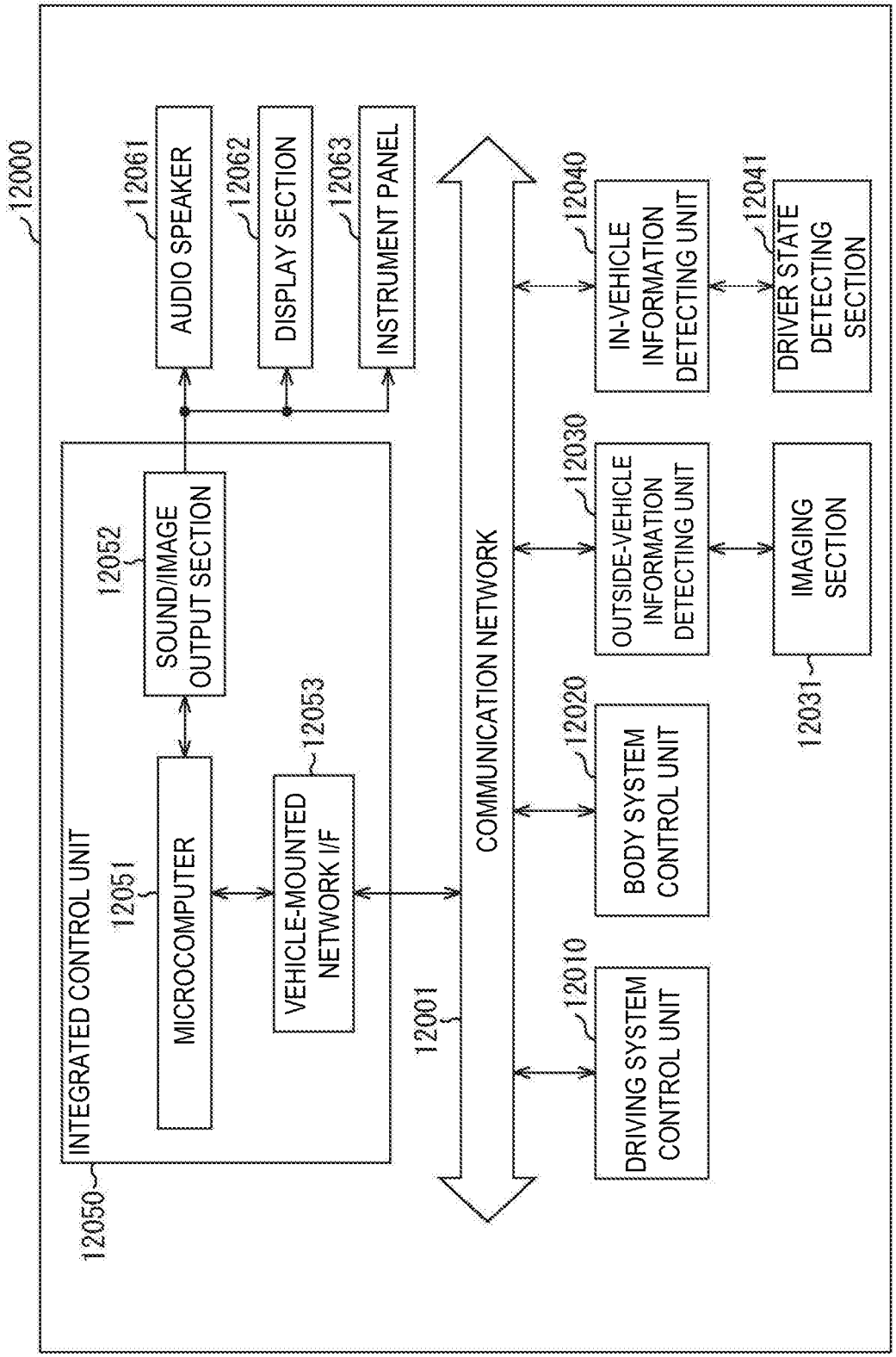
FIG. 31 is a block diagram depicting an example of schematic configuration of a vehicle control system.

FIG. 31 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 31, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12053, and a vehicle-mounted network interlace (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving, motor, or the like, a driving force transmitting mechanism for transmitting the driving force to wheels, a steering mechanism for adjusting the steering angle of the vehicle, a braking device for generating the braking: force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the storing mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling die headlamp so as to change from a high beam to a low beam, for example, m accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 31, an audio speaker 12061, a display section 12062, and an instrument panel 12063 are illustrated as the output device. The display section 12062 may, for example, include at least one of an on-board display and a head-up display.

Figure 32:
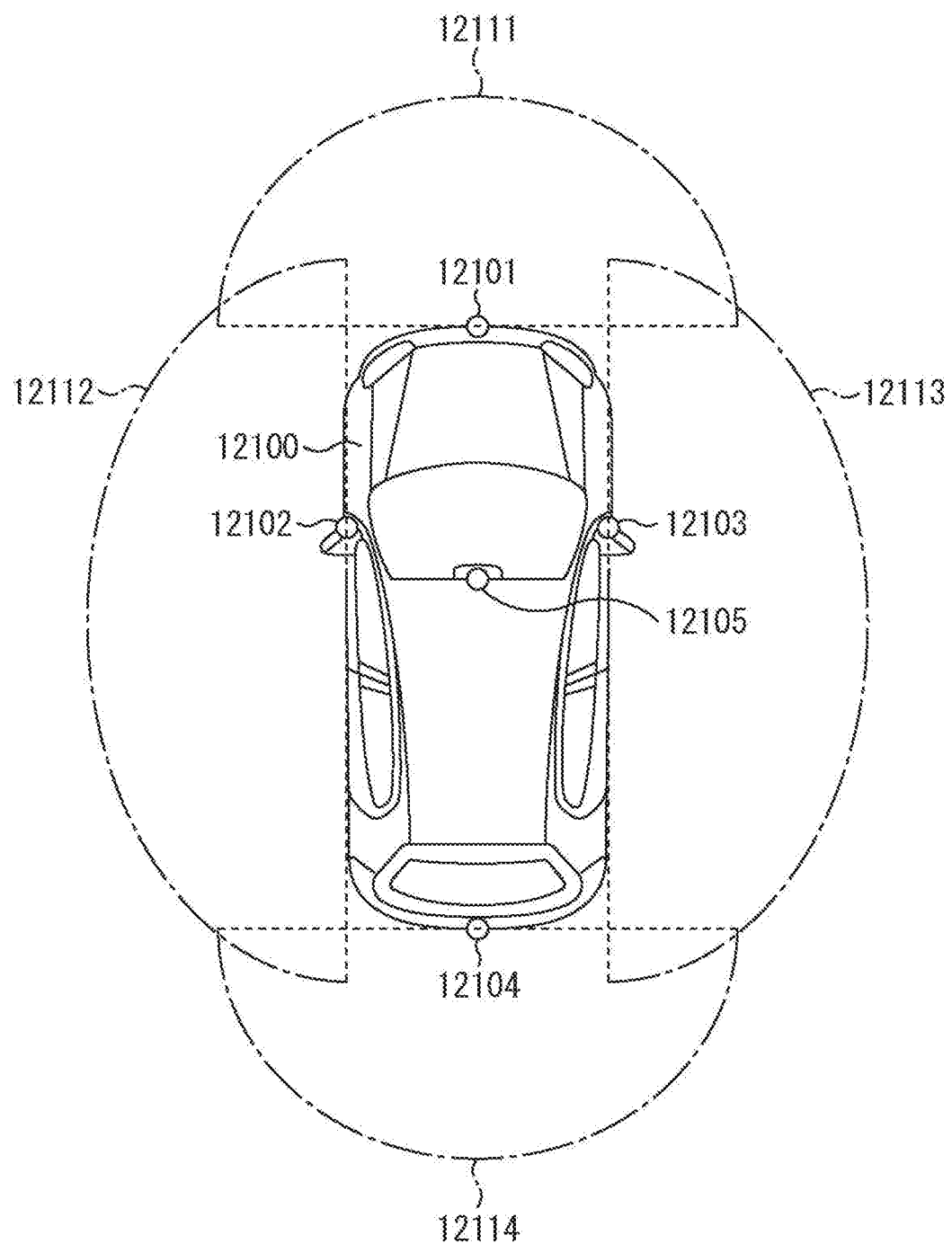
FIG. 32 is a diagram of assistance in explaining an example of installation positions of an outside-vehicle information detecting section and an imaging section.

FIG. 32 is a diagram depicting an example of the installation position of the imaging section 12031.

In FIG. 32, the vehicle 12100, as the imaging section 12031, includes the imaging sections 12101, 12102, 12103, 12104, and 12105.

The imaging sections 12101, 12102, 12103, 12104, and 12105 are, for example, disposed at positions on a from nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The image of the front obtained by the imaging section 12101 and the imaging section 12105 is used mainly to detect a preceding vehicle, a pedestrian, an obstacle, a signal a traffic sign, a lane, or the like.

In FIG. 32 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the in sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more, than 0 km/hour). Further the microcomputer 12051 can set a following distance to be maintained in front of a preceding vehicle in advance, and perform automatic brake control (including following stop control) automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

An example of the vehicle control system to which the technology according to an embodiment of the present disclosure is able to be applied has been described above.

The technology according to an embodiment of the present disclosure is able to be applied to the outside-vehicle information detecting unit 12030 or the image pickup unit 12031 among the configurations described above. Specifically, the light receiving element 1 having the pixel 201 is able to be applied to a distance detection process block of the outside-vehicle information detecting unit 12030 or the image pickup unit 12031. It is possible to measure a distance to an object such as a person, a car, an obstacle, a sign, or a character on a road surface with high accuracy, by applying the technology according to an embodiment of the present disclosure to the outside-vehicle information detecting unit 12030 or the image pickup unit 12031, it is possible to reduce fatigue of the driver by using the obtained distance information, and it is possible to increase safety of the driver or the vehicle.

The embodiments of the present technology are not limited to the above-described embodiments, and various changes can be made within a scope not deviating from the gist of the present technology.

Note that effects described in the present specification are merely examples, and live effects are not limited to the effects described in the present specification. There may be effects other than those described in the present specification.

Additionally, the present technology may also be configured as below.

(1)

A light receiving element including:

an on-chip lens;

a wiring layer; and a semiconductor layer disposed between the on-chip lens and the wiring layer, in which the semiconductor layer includes a first voltage applying unit to which a first voltage is applied, a second voltage applying unit to which a second voltage different from the first voltage is applied, a first charge detection unit disposed in a vicinity of the first voltage applying unit, and a second charge detection unit disposed in a vicinity of the second voltage applying unit, and the wiring layer includes a reflection suppressing structure that suppresses reflection of light in a plane region corresponding to the first charge detection unit and the second charge detection unit.

(2)

The light receiving element according to (1), in which the reflection suppressing structure is a film including polysilicon.

(3)

The light receiving element according to (1), in which the reflection suppressing structure is a film including a nitride film.

(4)

The light receiving element according to (1), in which the reflection suppressing structure is a structure in which a first reflection suppressing film including polysilicon and a second reflection suppressing film including a nitride film are stacked in a stacking direction of the wiring layer.

(5)

The light receiving element according to any one of (1) to (4), in which the wiring layer includes at least a wiring of one layer including a first voltage applying wiring for supplying the first voltage, a second voltage applying wiring for supplying the second voltage, and a reflection member, and the reflection member is not formed in the plane region corresponding to the first charge detection unit and the second charge detection unit.

(6)

The light receiving element according to (5), in which the wiring of one layer including the first voltage applying wiring, the second voltage applying wiring, anti the reflection member is a wiring closest to the semiconductor layer among wirings of a plurality of layers.

(7)

The light receiving element according to (5) or (6), in which the reflection member is a metal film.

(8)

The light receiving element according to any one of (1) to (7), in which the semiconductor layer further includes a first buried insulating film between the first voltage applying unit and the first charge detection unit and between the second voltage applying unit and the second charge detection unit.

(9)

The light receiving element according to (8), further including:

a light shielding film inside the first buried insulating film.

(10)

The light receiving element according to (8) or (9), in which the semiconductor layer further includes a second buried insulating film between the first charge detection unit and the second charge detection unit.

(11)

The light receiving element according to (10), further including:

a light shielding film inside the second buried insulating film between the first charge detection unit and the second charge detection unit.

(12)

An electronic apparatus including:

a light receiving element including an on-chip lens, a wiring layer, and a semiconductor layer disposed between the on-chip lens and the wiring layer, in which the semiconductor layer includes a first voltage applying unit to which a first voltage is applied, a second voltage applying unit to which a second voltage different from the first voltage is applied, a first charge detection unit disposed in a vicinity of the first voltage applying unit and a second charge detection unit disposed in a vicinity of the second voltage applying unit, and the wiring layer includes a reflection suppressing structure that suppresses reflection of light in a plane region corresponding to the first charge detection unit and the second charge detection unit.

REFERENCE SIGNS LIST

1 light, receiving element
21 pixel array unit
51 pixel
61 semiconductor substrate
62 on-chip lens
61-1, 65-2, 65 signal extraction unit
71-1, 71-2, 71 N+ semiconductor region
73-1, 73-2, 73 semiconductor region
91 multilayer wiring layer
92 interlayer insulating film
93 voltage applying wiring 94 reflection member
95 signal extraction wiring
96 wiring
101 transmission transistor
102 FD
103 additional capacitor
104 switching transistor
105 reset transistor
106 amplification transistor
107 selection transistor
M1 to M5 metal film

What is claimed is:

1. A light receiving element comprising:
an on-chip lens;
a wiring layer; and
a semiconductor layer disposed between the on-chip lens and the wiring layer,
wherein the semiconductor layer includes:
- a first voltage applying unit to which a first voltage is applied,
- a second voltage applying unit to which a second voltage different from the first voltage is applied,
- a first charge detection unit disposed in a vicinity of the first voltage applying unit, and
- a second charge detection unit disposed in a vicinity of the second voltage applying unit, and
wherein the wiring layer includes:
- a reflection suppressing structure that suppresses reflection of light in a plane region corresponding to the first charge detection unit and the second charge detection unit; and
- at least a wiring of one layer including a first voltage applying wiring for supplying the first voltage, a second voltage applying wiring for supplying the second voltage, and a reflection member, wherein the reflection member is not formed in the plane region corresponding to the first charge detection unit and the second charge detection unit.

2. The light receiving element according to claim 1, wherein the reflection suppressing structure is a film including polysilicon.

3. The light receiving element according to claim 1, wherein the reflection suppressing structure is a film including a nitride film.

4. The light receiving element according to claim 1, wherein the reflection suppressing structure is a structure in which a first reflection suppressing film including polysilicon and a second reflection suppressing film including a nitride film are stacked in a stacking direction of the wiring layer.

5. The light receiving element according to claim 1, wherein the wiring of one layer including the first voltage applying wiring, the second voltage applying wiring, and the reflection member is a wiring closest to the semiconductor layer among wirings of a plurality of layers.

6. The light receiving element according to claim 1, wherein the reflection member is a metal film.

7. The light receiving element according to claim 1, wherein the semiconductor layer further includes a first buried insulating film between the first voltage applying unit and the first charge detection unit and between the second voltage applying unit and the second charge detection unit.

8. The light receiving element according to claim 7, further comprising:
a light shielding film inside the first buried insulating film.

9. The light receiving element according to claim 7, wherein the semiconductor layer further includes a second buried insulating film between the first charge detection unit and the second charge detection unit.

10. The light receiving element according to claim 9, further comprising:
a light shielding film inside the second buried insulating film between the first charge detection unit and the second charge detection unit.

* * * * *